(12) United States Patent
Yamazaki et al.

(10) Patent No.: US 8,890,158 B2
(45) Date of Patent: Nov. 18, 2014

(54) SEMICONDUCTOR DEVICE

(71) Applicant: Semiconductor Energy Laboratory Co., Ltd., Atsugi (JP)

(72) Inventors: Shunpei Yamazaki, Setagaya (JP); Takahiro Tsuji, Okayama (JP); Teruaki Ochiai, Atsugi (JP); Koji Kusunoki, Kawasaki (JP); Hidekazu Miyairi, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/922,537

(22) Filed: Jun. 20, 2013

(65) Prior Publication Data

US 2013/0277671 A1    Oct. 24, 2013

Related U.S. Application Data

(63) Continuation of application No. 12/957,429, filed on Dec. 1, 2010, now Pat. No. 8,470,649.

(30) Foreign Application Priority Data

Dec. 4, 2009    (JP) ................................. 2009-276740

(51) Int. Cl.
*H01L 29/04* (2006.01)
*H01L 31/036* (2006.01)
*H01L 31/0376* (2006.01)
*H01L 31/20* (2006.01)
*H01L 29/45* (2006.01)
*H01L 29/786* (2006.01)

(52) U.S. Cl.
CPC ............ *H01L 29/7869* (2013.01); *H01L 29/45* (2013.01)
USPC .. 257/59; 257/72; 257/E29.117; 257/E29.273

(58) Field of Classification Search
USPC .............. 257/59, 72, 347, E29.117, E29.273
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1 737 044 A    12/2006
EP    2 226 847 A    9/2010
(Continued)

OTHER PUBLICATIONS

Fortunato et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

(Continued)

*Primary Examiner* — Hoai V Pham
(74) *Attorney, Agent, or Firm* — Eric J. Robinson; Robinson Intellectual Property Law Office, P.C.

(57) ABSTRACT

An object is to provide a highly reliable transistor and a semiconductor device including the transistor. A semiconductor device including a gate electrode; a gate insulating film over the gate electrode; an oxide semiconductor film over the gate insulating film; and a source electrode and a drain electrode over the oxide semiconductor film, in which activation energy of the oxide semiconductor film obtained from temperature dependence of a current (on-state current) flowing between the source electrode and the drain electrode when a voltage greater than or equal to a threshold voltage is applied to the gate electrode is greater than or equal to 0 meV and less than or equal to 25 meV, is provided.

17 Claims, 23 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,767,106 B2 | 8/2010 | Chang |
| 7,791,074 B2 | 9/2010 | Iwasaki |
| 8,384,077 B2 * | 2/2013 | Yano et al. ............... 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0325341 A1 | 12/2009 | Itagaki et al. |
| 2010/0065844 A1 | 3/2010 | Tokunaga |
| 2010/0092800 A1 | 4/2010 | Itagaki et al. |
| 2010/0097301 A1 | 4/2010 | Sumiya et al. |
| 2010/0109002 A1 | 5/2010 | Itagaki et al. |
| 2010/0276689 A1 | 11/2010 | Iwasaki |
| 2010/0279462 A1 | 11/2010 | Iwasaki |
| 2011/0006297 A1 * | 1/2011 | Inoue et al. ............... 257/43 |
| 2011/0121289 A1 | 5/2011 | Miyanaga et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-342732 | 12/2004 |
| JP | 2007-096055 | 4/2007 |
| JP | 2007-103918 A | 4/2007 |
| JP | 2007-123861 | 5/2007 |
| JP | 2008-042067 A | 2/2008 |
| JP | 2010-106291 | 5/2010 |
| WO | WO 2004/114391 | 12/2004 |
| WO | WO 2007/029844 | 3/2007 |
| WO | WO-2009/075161 | 6/2009 |

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

(56) References Cited

OTHER PUBLICATIONS

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Hayashi et al., "42.1: Invited Paper: Improved Amorphous In-Ga-Zn-O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$-$Ga_2ZnO_4$-ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ ($m$ = 3, 4, and 5), $InGaO_3(ZnO)_3$, and $Ga_2O_3(ZnO)_m$ ($m$ = 7, 8, 9, and 16) in the $In_2O_3$-$ZnGa_2O_4$-ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds $InMO_3(ZnO)_m$ ($M$=In,Ga; $m$=Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9th International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In-Ga-Zn-Oxide TFTs," IDW '09: Proceedings of the 16th International Display Workshops, 2009, pp. 689-692.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Osada et al., "Development of Driver-Integrated Panel using Amorphous In-Ga-Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Ohara et al., "21.3: 4.0 in. QVGA AMOLED Display Using In-Ga-Zn-Oxide TFTs with a Novel Passivation Layer," SID Digest '09: SID International Symposium Digest of Technical Papers, May 31, 2009, pp. 284-287.

Miyasaka, "Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13th International Display Workshops, Dec. 7, 2006, pp. 663-666.

(56) References Cited

OTHER PUBLICATIONS

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," Nirim Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] at Temperatures Over 1000° C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the $6^{th}$ International Display Workshops, Dec. 3, 2008, pp. 581-584.

Kim et al., "High-Performance oxide thin film transistors passivated by various gas plasmas," $214^{th}$ ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

International Search Report (Application No. PCT/JP2010/070161) Dated Jan. 11, 2011.

Written Opinion (Application No. PCT/JP2010/070161) Dated Jan. 11, 2011.

\* cited by examiner

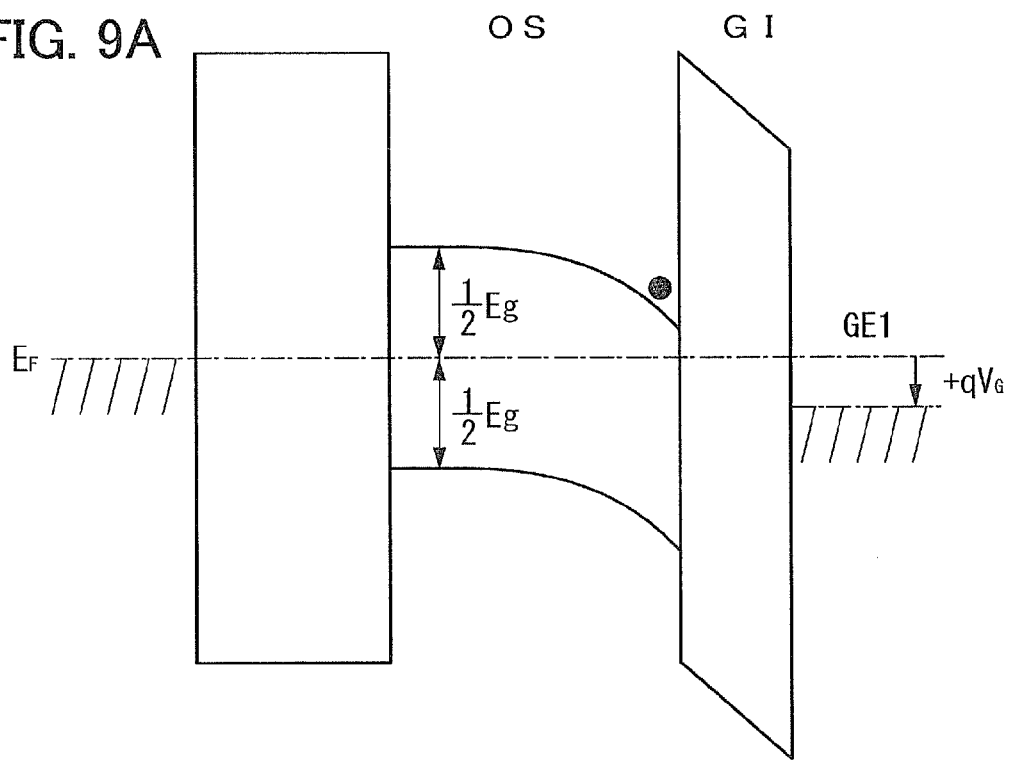
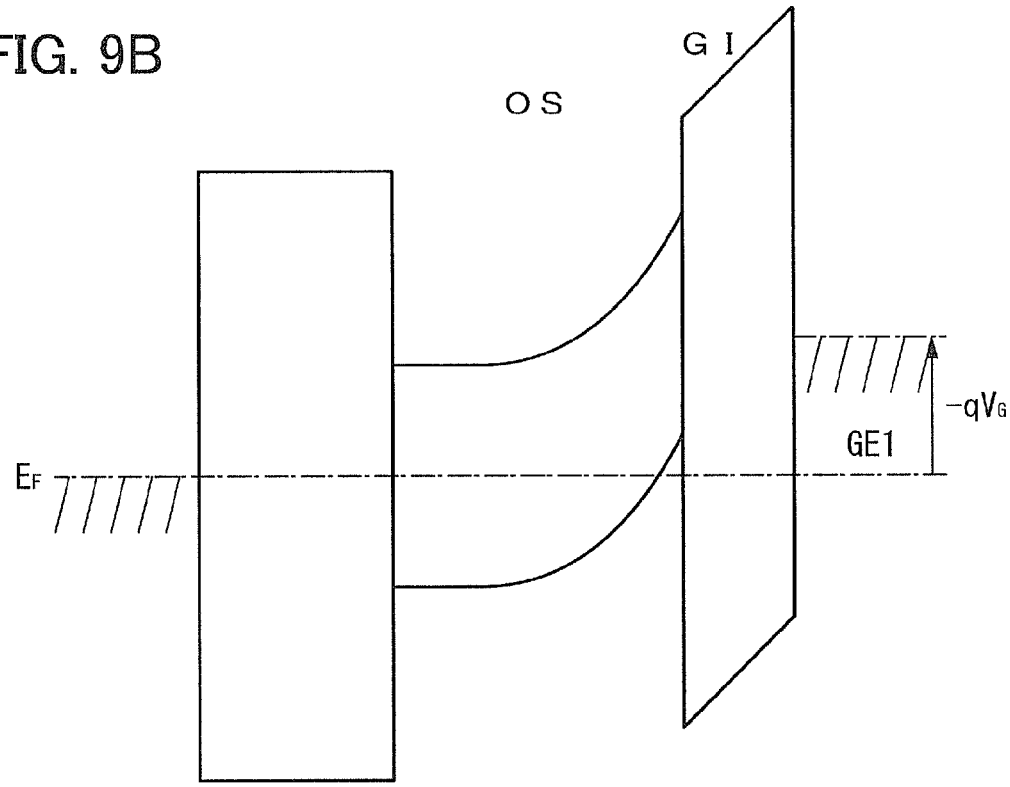

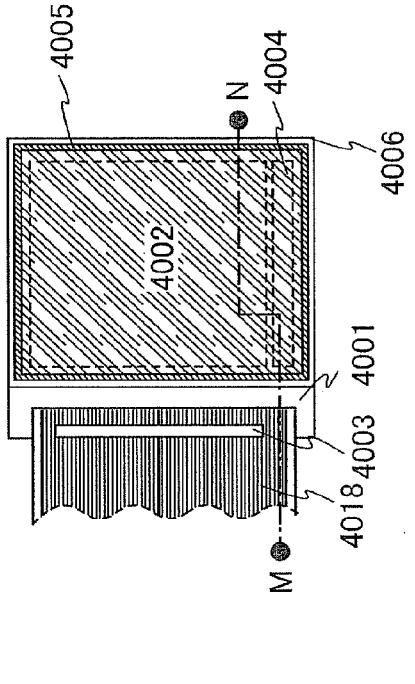
FIG. 11A1
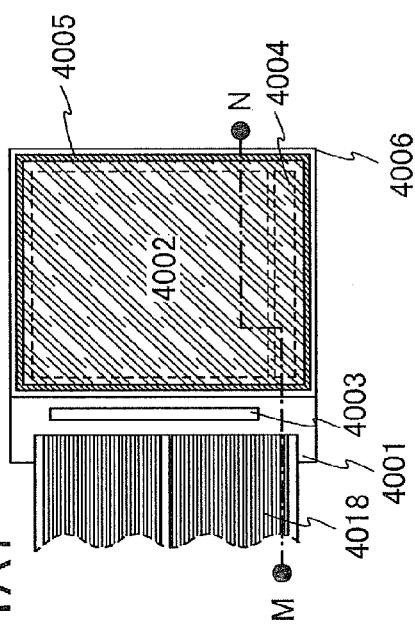
FIG. 11A2
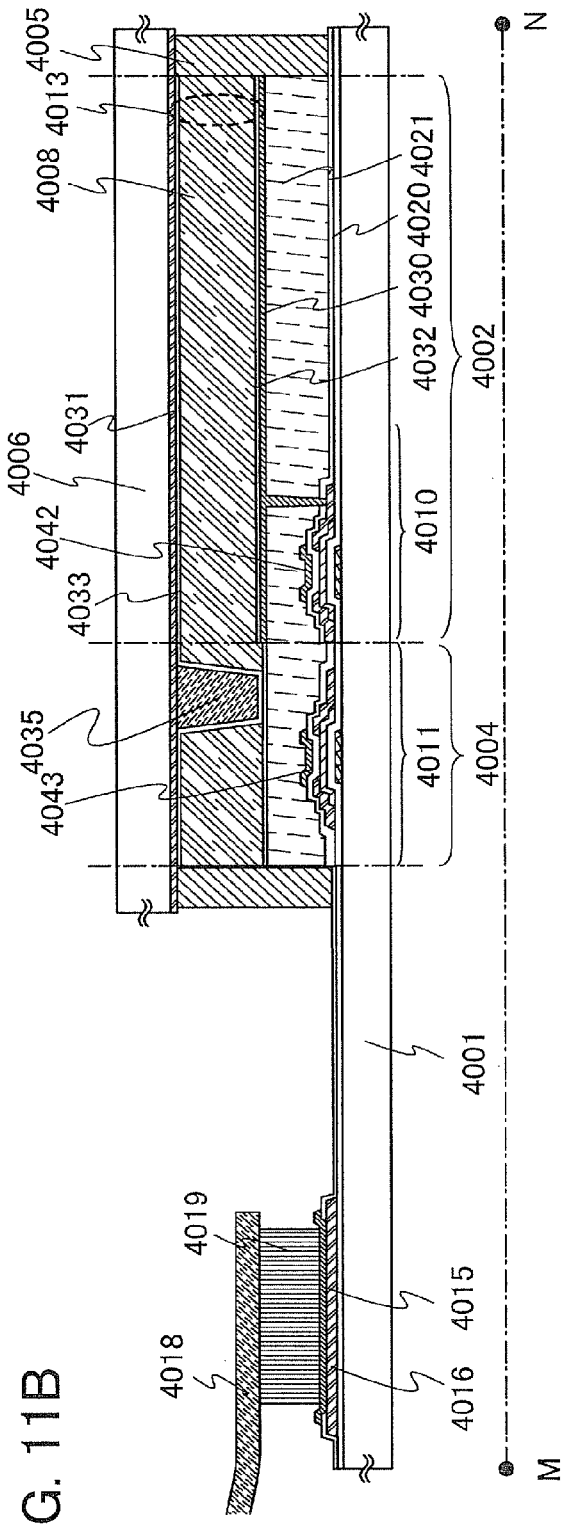
FIG. 11B

SEMICONDUCTOR DEVICE

TECHNICAL FIELD

The present invention relates to a transistor such as a thin film transistor (hereinafter also referred to as a TFT), and a semiconductor device including the transistor.

In this specification, a semiconductor device means all types of devices which can function by utilizing semiconductor characteristics, and an electro-optical device, a semiconductor circuit, and an electronic device are all semiconductor devices.

BACKGROUND ART

In recent years, techniques to form thin film transistors (TFT) using a semiconductor thin film (with a thickness of approximately several nanometers to several hundreds of nanometers) which is formed over a substrate having an insulating surface have attracted attention. Thin film transistors are applied to a wide range of electronic devices such as ICs or electro-optical devices, and prompt development of thin film transistors that are to be used as switching elements in image display devices, in particular, is being pushed. Various metal oxides are used for a variety of applications. Indium oxide is a well-known material and is used as a light-transmitting electrode material which is necessary for liquid crystal displays and the like.

Some metal oxides have semiconductor characteristics. The examples of such metal oxides having semiconductor characteristics include tungsten oxide, tin oxide, indium oxide, zinc oxide, and the like. Thin film transistors in which a channel formation region is formed using such a metal oxide having semiconductor characteristics are already known (for example, see Patent Documents 1 and 2).

REFERENCE

[Patent Document 1]
Japanese Published Patent Application No. 2007-123861
Japanese Published Patent Application No. 2007-096055

DISCLOSURE OF INVENTION

A transistor used for a semiconductor device is required to have favorable transistor characteristics such as on-state current, off-state current, and electron mobility. By using a transistor having favorable characteristics, the semiconductor device can be driven at higher speed. In addition, by preventing deterioration or variation of a transistor to improve the reliability, a highly reliable semiconductor device can be provided.

The operation temperature range of a semiconductor device such as a display panel is generally higher than or equal to 0° C. and lower than or equal to 40° C. Further, heat resistance of higher than or equal to −30° C. and lower than or equal to 105° C. is required for an in-car display panel and the like. Thus, a transistor that is mounted on such a semiconductor device is required to have stable operation characteristics in a wide temperature range.

Therefore, it is an object of an embodiment of the present invention to provide a highly reliable transistor and a semiconductor device including the transistor. In addition, it is an object of an embodiment of the present invention to provide a transistor which operates stably in a wide temperature range and a semiconductor device including the transistor.

The semiconductor device according to an embodiment of the present invention includes an oxide semiconductor film. The oxide semiconductor film is highly purified by removing impurities, particularly water and hydrogen, so that an intrinsic (i-type) or substantially intrinsic oxide semiconductor film can be realized.

Specifically, a semiconductor device according to an embodiment of the present invention includes a gate electrode; a gate insulating film over the gate electrode; an oxide semiconductor film over the gate insulating film; and a source electrode and a drain electrode over the oxide semiconductor film, in which activation energy of the oxide semiconductor film obtained from temperature dependence of a current (on-state current) flowing between the source electrode and the drain electrode when a voltage greater than or equal to a threshold voltage is applied to the gate electrode is greater than or equal to 0 meV and less than or equal to 25 meV.

Further, a semiconductor device according to an embodiment of the present invention includes a gate electrode; a gate insulating film over the gate electrode; an oxide semiconductor film over the gate insulating film; a source electrode and a drain electrode over the oxide semiconductor film; and an insulating film being in contact with a part of the oxide semiconductor film, over the source electrode and the drain electrode, in which activation energy of the oxide semiconductor film obtained from temperature dependence of a current (on-state current) flowing between the source electrode and the drain electrode when a voltage greater than or equal to a threshold voltage is applied to the gate electrode is greater than or equal to 0 meV and less than or equal to 25 meV.

In the semiconductor device according to an embodiment of the present invention described above, a film thickness of the gate insulating film is greater than or equal to 10 nm and less than or equal to 500 nm.

In the semiconductor device according to an embodiment of the present invention described above, a film thickness of the oxide semiconductor film is greater than or equal to 10 nm and less than or equal to 300 nm.

In the semiconductor device according to an embodiment of the present invention described above, the source electrode and the drain electrode include titanium, magnesium, yttrium, aluminum, tungsten, or molybdenum.

By implementing an embodiment of the present invention, a highly reliable semiconductor device can be manufactured. Further, a semiconductor device with low power consumption can be manufactured. Furthermore, a semiconductor device which can operate in a wide temperature range, with low temperature dependence can be manufactured.

BRIEF DESCRIPTION OF DRAWINGS

FIG. 9A illustrates a state where a positive voltage ($V_G > 0$) is applied to a gate (GE1) and FIG. 9B illustrates a state where a negative voltage ($V_G > 0$) is applied to the gate (GE1).

FIGS. 11A1, 11A2, and 11B are plan views and a cross-sectional view illustrating an embodiment of the present invention.

BEST MODE FOR CARRYING OUT THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiment modes below.

Embodiment 1

In this embodiment, a bottom gate transistor having a channel-etched structure is taken as an example, and a structure of the transistor according to one embodiment of the present invention will be described.

Figure 1A:
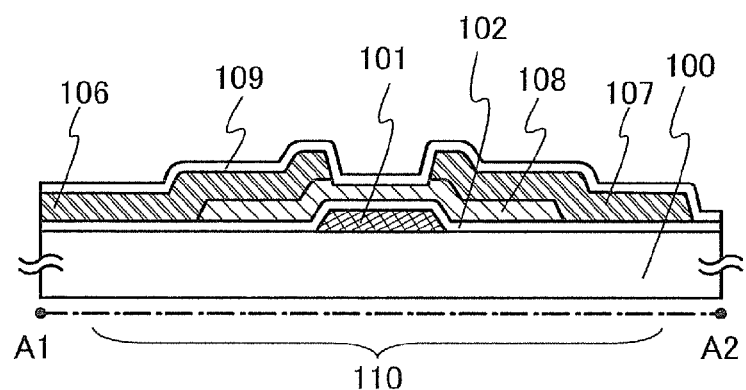
FIGS. 1A and 1B are a cross-sectional view and a top view, respectively, illustrating a semiconductor device of an embodiment of the present invention.
Figure 1B:
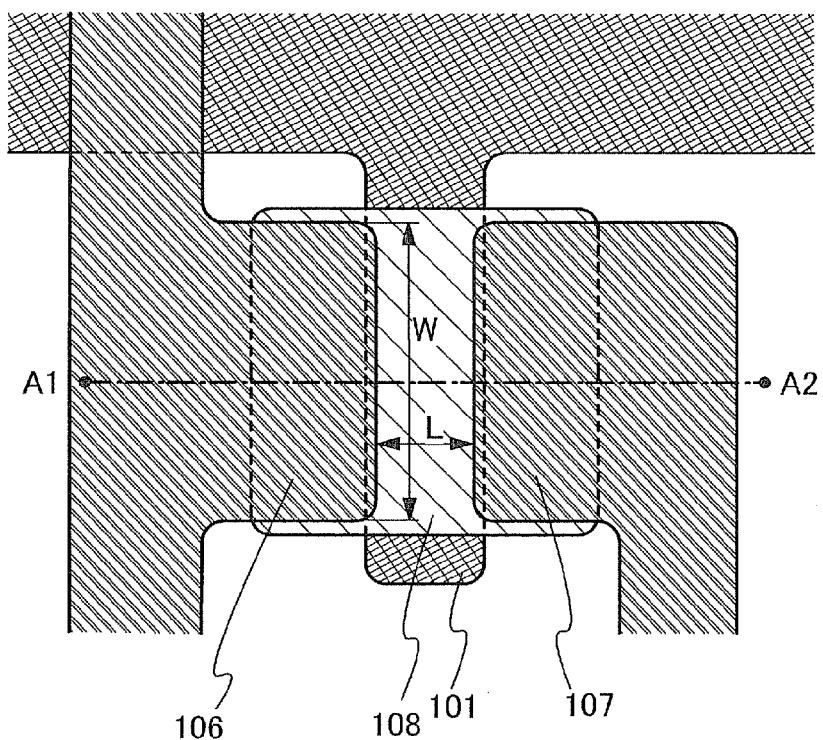

FIG. 1A illustrates a cross-sectional view of a transistor 110 and FIG. 1B illustrates a top view of the transistor 110 illustrated in FIG. 1A. Note that a cross-sectional view taken along a dashed line A1-A2 in FIG. 1B corresponds to FIG. 1A.

The transistor 110 includes a gate electrode 101 formed over a substrate 100 having an insulating surface, a gate insulating film 102 over the gate electrode 101, an oxide semiconductor film 108 which overlaps with the gate electrode 101 with the gate insulating film 102 therebetween and a pair of a source electrode 106 and a drain electrode 107 formed over the oxide semiconductor film 108. Further, the transistor 110 may include an insulating film 109 formed over the oxide semiconductor film 108 as its component. The transistor 110 illustrated in FIGS. 1A and 1B has a channel-etched structure in which part of the oxide semiconductor film 108 between the source electrode 106 and the drain electrode 107 is etched. An insulating film serving as a base film may be provided between the gate electrode 101 and the substrate 100.

In the transistor 110 illustrated in FIGS. 1A and 1B, the oxide semiconductor film is preferably an oxide semiconductor film which is purified by sufficiently removing impurities such as hydrogen or water therefrom and supplying oxygen thereto. The oxide semiconductor film which is purified has a sufficiently low carrier concentration (e.g., less than $1\times10^{12}/\text{cm}^3$, preferably less than $1\times10^{11}/\text{cm}^3$, the value as close to zero as possible). The transistor 110 with excellent off-state current characteristics can be obtained with the use of such an i-type or substantially i-type oxide semiconductor. Further, the transistor 110 in which activation energy obtained from the temperature dependence of on-state current is sufficiently low (e.g., greater than or equal to 0 meV and less than or equal to 25 meV, preferably, greater than or equal to 0 meV and less than or equal to 20 meV) and the temperature dependence of the on-state current is extremely low can be obtained.

How characteristics of the transistor are affected by high purification of the oxide semiconductor film by removal of impurities such as hydrogen, water, or the like contained in the oxide semiconductor film as much as possible to be intrinsic (i-type) as in this embodiment will be described.

<Electrical Conduction Mechanism of Transistor Including Oxide Semiconductor>

An electrical conduction mechanism of a transistor including an oxide semiconductor will be described with reference to FIG. 7, FIG. 8, FIGS. 9A and 9B, and FIG. 10. Note that the following description is based on the assumption of an ideal situation for simplification and does not necessarily reflect a real situation. In addition, the following description is only an examination.

Figure 7:
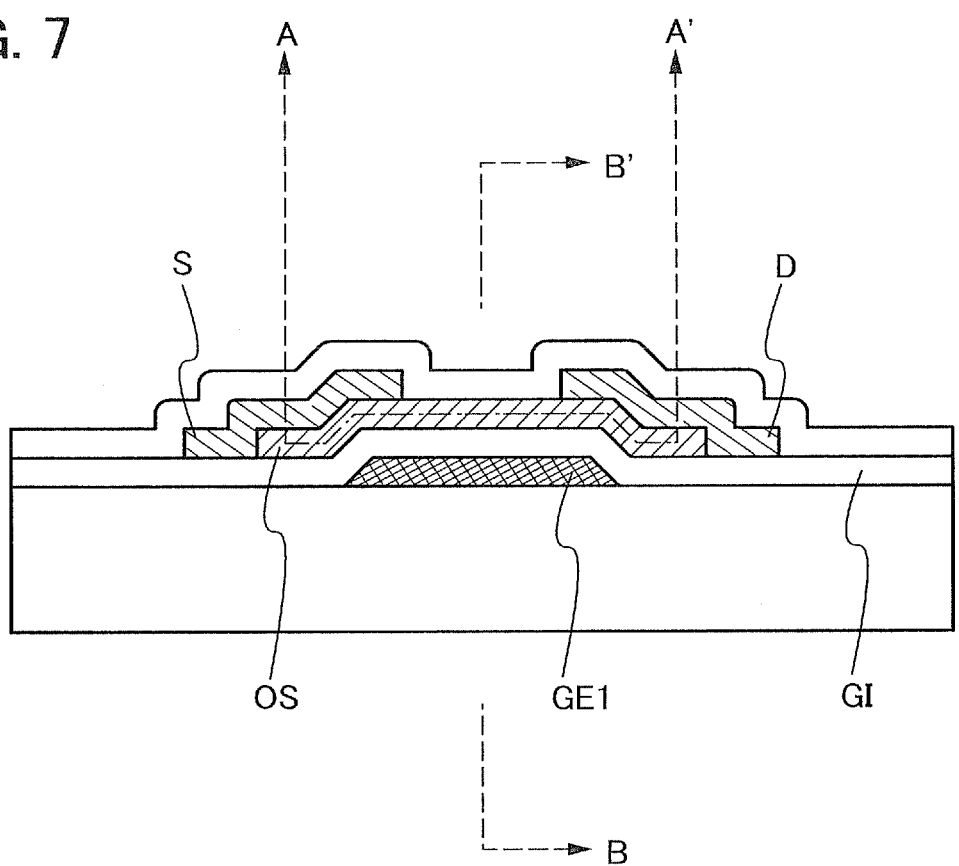
FIG. 7 is a longitudinal sectional view of an inverted staggered transistor including an oxide semiconductor.

FIG. 7 is a longitudinal sectional view of an inverted staggered thin film transistor in which an oxide semiconductor is used. An oxide semiconductor film (OS) is provided over a gate electrode (GE1) with a gate insulating film (GI) therebetween, and a source electrode (S) and a drain electrode (D) are provided over the oxide semiconductor film. Further, an insulating layer is provided so as to cover the source electrode (S) and the drain electrode (D).

Figure 8:
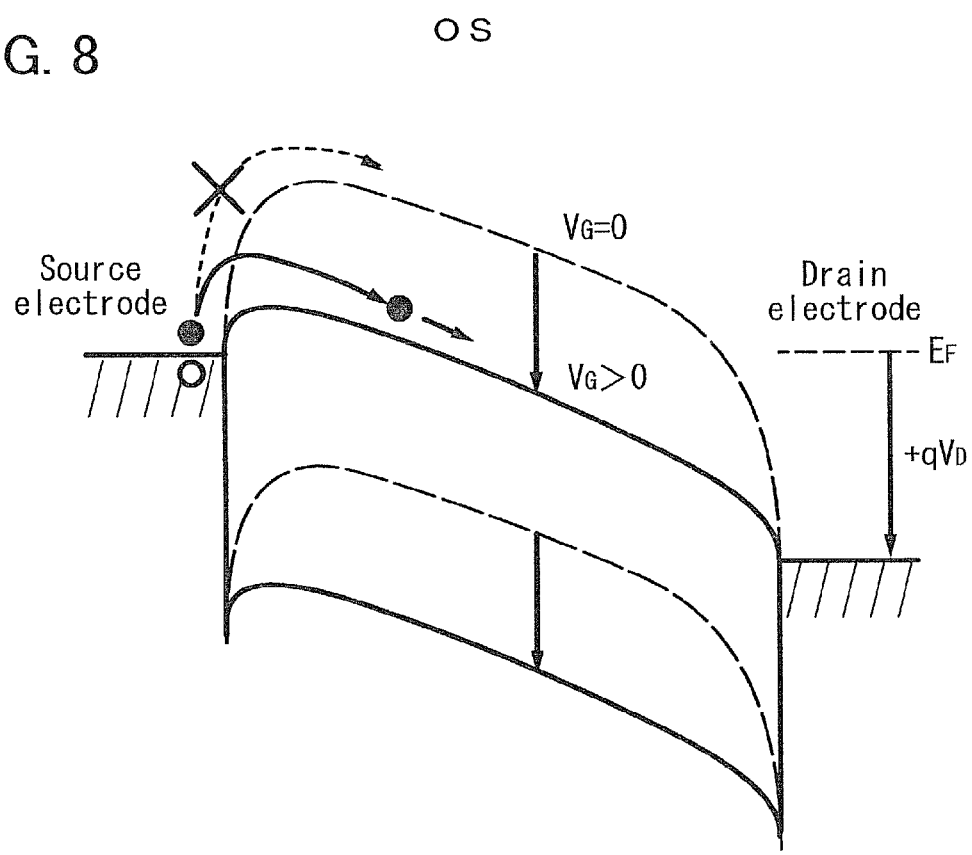
FIG. 8 is an energy band diagram (schematic diagram) of a cross section taken along line A-A' in FIG. 7.

FIG. 8 is an energy band diagram (schematic diagram) of a cross section taken along line A-A' in FIG. 7. In FIG. 8, a black circle (●) and a white circle (○) represent an electron and a hole and have electric charges (−q, +q), respectively. With a positive voltage ($V_D > 0$) applied to the drain electrode, the dashed line shows the case where no voltage is applied to the gate electrode ($V_G = 0$) and the solid line shows the case where a positive voltage is applied to the gate electrode ($V_G > 0$). In the case where no voltage is applied to the gate electrode, carriers (electrons) are not injected to the oxide semiconductor side from an electrode because of high potential barrier, so that a current does not flow, which means an off state. On the other hand, when a positive voltage is applied to the gate electrode, potential barrier is lowered, and thus a current flows, which means an on state.

FIGS. 9A and 9B are energy band diagrams (schematic diagrams) of a cross section taken along line B-B' in FIG. 7. FIG. 9A illustrates a state where a positive voltage ($V_G>0$) is applied to a gate electrode (GE1) and an on state where carriers (electrons) flow between the source electrode and the drain electrode. A state where a negative voltage ($V_G<0$) is applied to the gate electrode (GE1), i.e., an off-state (a state where minority carriers do not flow) is illustrated in FIG. 9B.

Figure 10:
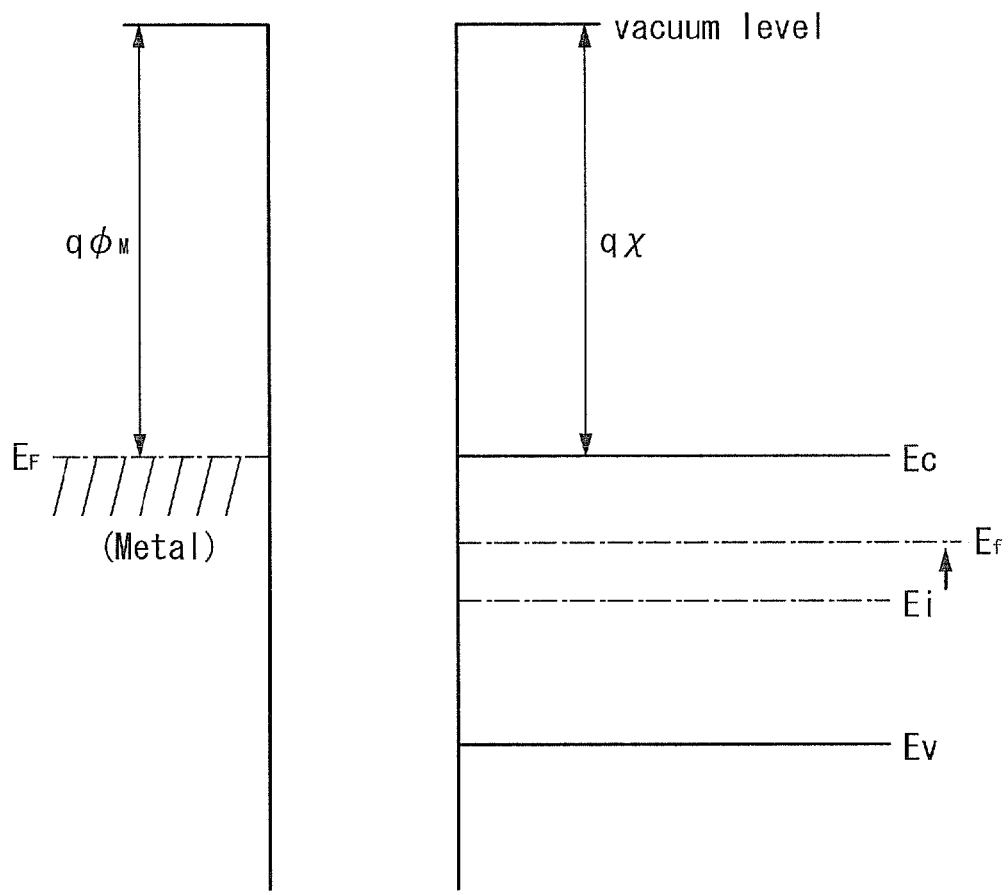
FIG. 10 illustrates a relation between the vacuum level and the work function ($\phi_M$) of a metal and a relation between the vacuum level and the electron affinity ($\chi$) of the oxide semiconductor.

FIG. 10 shows the relation between a vacuum level and a work function ($\phi_M$) of metal and the relation between the vacuum level and electron affinity ($\chi$) of the oxide semiconductor.

A conventional oxide semiconductor is generally of n-type, and the Fermi level ($E_F$) in that case is positioned closer to the conduction band (Ec) and is away from the intrinsic Fermi level ($E_i$) that is located in the middle of the band gap. Note that it is known that hydrogen in the oxide semiconductor is a donor and is one factor causing an oxide semiconductor to be an n-type semiconductor.

In contrast, the oxide semiconductor according to the present invention is an intrinsic (i-type) or substantially intrinsic oxide semiconductor which is obtained by removing hydrogen that is a factor for an n-type semiconductor from an oxide semiconductor and highly purifying the oxide semiconductor so that impurities that are not main components of the oxide semiconductor are contained as little as possible. In other words, a purified i-type (intrinsic) semiconductor or a semiconductor close thereto is obtained not by adding impurities but by removing impurities such as hydrogen or water as much as possible. This enables the Fermi level ($E_F$) to be at the same level as the intrinsic Fermi level ($E_i$).

It is said that the bang gap ($E_g$) of an oxide semiconductor is 3.15 eV, and the electron affinity ($\chi$) thereof is 4.3 V. The work function of titanium (Ti) used for forming the source and drain electrodes is substantially equal to the electron affinity ($\chi$) of the oxide semiconductor. In that case, a Schottky barrier for electrons is not formed at the interface between metal and an oxide semiconductor.

In this case, as shown in FIG. 9A, the electron moves along the lowest part of the oxide semiconductor, which is energetically stable, at an interface between the gate insulating film and the highly-purified oxide semiconductor.

In FIG. 9B, when a negative potential is applied to the gate electrode (GE1), a hole which is a minority carrier is substantially zero; therefore, current is as close to zero as possible.

For example, even when a thin film transistor has a channel width (W) of $1\times10^4$ μm and a channel length (L) of 3 μm, an off-state current of less than or equal to $10^{-13}$ A and a subthreshold swing (S value) of 0.1 V/dec (the thickness of the gate insulating film: 100 nm) can be obtained.

As described above, the oxide semiconductor film is highly purified so that impurities such as water or hydrogen except a main component of the oxide semiconductor are contained as little as possible, whereby the operation of the thin film transistor can be favorable.

<Advantage in Process as Compared to Other Semiconductor Material>

Note that silicon carbide (e.g., 4H—SiC) is given as a semiconductor material which can be compared with an oxide semiconductor. An oxide semiconductor and 4H—SiC have some things in common. One example is carrier density. In accordance with Fermi-Dirac distribution, the density of minority carriers in an oxide semiconductor is estimated to be approximately $10^{-7}/cm^3$. This value of the minority carrier density is extremely small similarly to that in 4H—SiC, $6.7\times10^{-11}/cm^3$. When the minority carrier density of the oxide semiconductor is compared with the intrinsic carrier density of silicon (approximately $1.4\times10^{10}/cm^3$), it is easy to understand that the minority carrier density of the oxide semiconductor is significantly low.

In addition, the energy band gap of the oxide semiconductor is 3.0 eV to 3.5 eV and that of 4H—SiC is 3.26 eV, which means that both the oxide semiconductor and silicon carbide are wide band gap semiconductors.

In contrast, there is a major difference between the oxide semiconductor and silicon carbide, that is, the process temperature. Since silicon carbide generally needs to be subjected to heat treatment at 1500° C. to 2000° C., it is difficult to form a stack of silicon carbide and a semiconductor element formed using a semiconductor material which is not silicon carbide. This is because a semiconductor substrate, a semiconductor element, and the like are damaged by such high temperature. On the other hand, the oxide semiconductor can be formed with heat treatment at 300° C. to 500° C. (at a temperature equal to or lower than the glass transition temperature, approximately 700° C. at the maximum); therefore, a semiconductor element can be formed using an oxide semiconductor after an integrated circuit is formed using another semiconductor material.

The oxide semiconductor has an advantage over silicon carbide in that a low heat-resistant substrate such as a glass substrate can be used. Moreover, the oxide semiconductor also has an advantage in that energy costs can be sufficiently reduced as compared to silicon carbide because heat temperature at high temperature is not necessary.

Further, in the silicon carbide, crystal defects and a small amount of impurities mixed without an intention become a factor that generates carriers. Thus, the low carrier density equivalent to the oxide semiconductor of the present invention is obtained in the silicon carbide in theory; however it is difficult to obtain the carrier density lower than $10^{12}/cm^3$ for the reason noted above in actuality. The above can be also said on a comparison between gallium nitride and an oxide semiconductor.

An oxide semiconductor is generally considered as an n-type semiconductor; however, according to one embodiment of the invention disclosed herein, an i-type semiconductor can be realized by removing impurities, particularly water and hydrogen. From this aspect, different from the case of silicon which is made to be an i-type silicon by adding an impurity, one embodiment of the disclosed invention includes a novel technical idea.

In such a manner, not only by simply using an oxide semiconductor with a wide band gap for a transistor, but also by reducing impurities to be donors, such as hydrogen, and thus setting the carrier density less than $1\times10^{12}/cm^3$, preferably less than $1.45\times10^{10}/cm^3$, thermally excited carriers at practical operation temperatures can be removed, so that a transistor can be operated by only carriers injected from the source side. Therefore, a transistor having the off-state current of $1\times10^{-13}$ A or less can be obtained.

<Temperature Dependence of Off-State Current>

Next, the temperature characteristics of off-state current of the transistor manufactured in this embodiment is evaluated. Temperature characteristics are important in considering the environmental resistance, maintenance of performance, or the like of an end product in which the transistor is used. It is to be understood that a smaller amount of change is more preferable, which increases the degree of freedom for product designing.

First, a method for manufacturing a transistor used for measurement is described below. In this embodiment, 20,000 transistors each having a channel length L of 10 μm and a channel width W of 50 μm were connected in parallel to form a bottom gate transistor having a channel etched structure with L/W=10 μm/1,000,000 μm (1 m).

First, heat treatment was performed three times on a glass substrate at 650° C. for six minutes with the use of a GRTA apparatus. Next, a silicon nitride layer with a thickness of 100 nm was formed as a base film over the glass substrate by a CVD method, and a silicon oxynitride layer with a thickness of 150 nm was formed over the silicon nitride layer. Subsequently, a tungsten layer with a thickness of 100 nm was formed over the silicon oxynitride layer by a sputtering method as a gate electrode, and then, the tungsten layer was selectively etched to form the gate electrode.

Then, a silicon oxynitride layer having a thickness of 100 nm was formed as a gate insulating film over the gate electrode by a CVD method.

Then, an oxide semiconductor film having a thickness of 30 nm was formed over the gate insulating layer by a sputtering method using an In—Ga—Zn—O-based oxide semiconductor film formation target (at a molar ratio of $In_2O_3$:$Ga_2O_3$:ZnO=1:1:1). Here, an island-shaped oxide semiconductor layer was formed by selectively etching the oxide semiconductor film.

Next, first heat treatment was performed on the oxide semiconductor film at 650° C. for 6 minutes in a nitrogen atmosphere with the use of a GRTA apparatus.

Next, as a conductive film for forming a source electrode and a drain electrode, a 100-nm-thick titanium layer, a 200-nm-thick aluminum layer, and a 100-nm-thick titanium layer were stacked over the oxide semiconductor film by a sputtering method. The conductive film was selectively etched to form the source electrode and the drain electrode. Note that 20,000 transistors (width: 100, length: 200) each having a channel length L of 10 μm and a channel width W of 50 μm were connected in parallel to obtain a transistor with L/W=10 μm/1,000,000 μm (1 m).

Then, a silicon oxide layer with a thickness of 300 nm was formed as an insulating film so as to be in contact with the oxide semiconductor film by a sputtering method after heat treatment for 1 hour in a nitrogen atmosphere. Then, an acrylic resin film with a thickness of 1.5 μm was formed as a planarization film. Here, the silicon oxide layer and the planarization film were etched selectively so that openings were formed over the source electrode layer or the drain electrode layer. After that, an indium tin oxide (ITO) layer was formed with a thickness of 110 nm as a transparent conductive layer electrically connected to the source electrode layer or the drain electrode layer, and heat treatment was performed at 250° C. for 1 hour in a nitrogen atmosphere.

Through the above process, a bottom-gate transistor was manufactured.

For the measurement of the temperature characteristics, the Vg-Id characteristics were obtained under the conditions where substrates provided with transistors were kept at respective constant temperatures of −30° C., 0° C., 25° C., 40° C., 60° C., 80° C., 100° C., and 120° C. by using a constant-temperature chamber; the drain voltage was set to 6 V; and the gate voltage was changed from −20 V to +20V.

Figure 4:
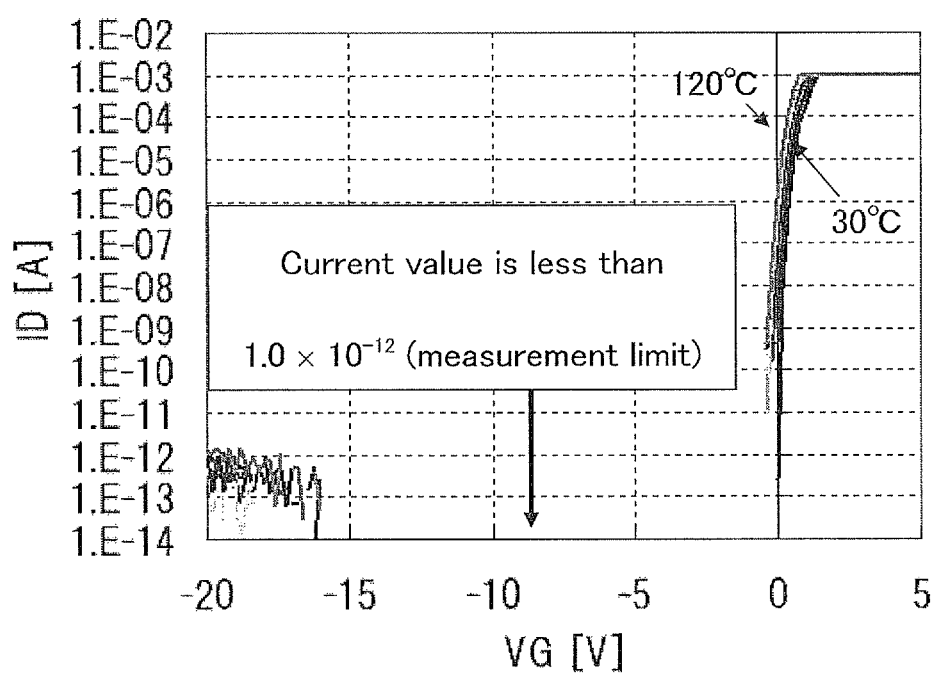
FIG. 4 shows Vg-Id characteristics (temperature characteristics) of a transistor including an oxide semiconductor.

FIG. 4 shows Vg-Id characteristics measured at each of the above temperatures and interposed in the graph. The rightmost curve indicated by an arrow in the graph is a curve obtained at −30° C.; the leftmost curve is a curve obtained at 120° C.; and curves obtained at the other temperatures are located therebetween. The off-state current (Ioff) is $1\times10^{-12}$ A or less, which is near the resolution of the measurement device, at all the temperatures except the case where the gate voltage is around 20 V, and the temperature dependence thereof is hardly observed. In other words, even at a low temperature of −30° C. or a high temperature of 120° C., the off-state current is kept less than or equal to $1\times10^{-12}$ A, and given that the channel width W is 1 m, it can be seen that the off-state current is significantly small.

As the measurement device, a semiconductor parameter analyzer (Agilent 4156C manufactured by Agilent Technologies Inc. (100 fA)) was used.

A transistor including a highly-purified oxide semiconductor (purified OS) shows almost no temperature dependence of off-state current. Since the conductivity type becomes extremely close to an intrinsic type and the Fermi level is located in the middle of the forbidden band by purifying an oxide semiconductor, the purified oxide semiconductor does not show temperature dependence thereof. This also results from the fact that the oxide semiconductor has an energy gap of 3 eV or more and includes very few thermally excited carriers. In addition, the source region and the drain region are in a degenerated state, which is also a factor for showing no temperature dependence. The transistor is mainly operated with carriers which are injected from the degenerated source region to the oxide semiconductor, and the above characteristics (no temperature dependence of off-state current) can be explained by independence of carrier density on temperature.

(Activation Energy in On-State Current)

Then, activation energy obtained from the temperature dependence of on-state current (Ion) of a transistor whose manufacturing method is described in this embodiment is evaluated. It is known that the activation energy is calculated from Arrhenius plots.

In this embodiment, the temperature dependence of on-state current (Ion) of a transistor when drain voltage (Vd) is constant (specifically, 10V) and gate voltage (Vg) is greater than or equal to threshold voltage (Vth) (specifically, Vg=Vth+10V) is measured, and activation energy is calculated from the slope of an approximate line of the Arrhenius plots. The temperature range of the measurement is −30° C. to 120° C.

Note that there is a correlation between the activation energy and the temperature dependence of a transistor. The low activation energy in the on-state current of a transistor has the same meaning that barrier height which inhibits carrier conduction is low, as the slope of the Arrhenius plots is gradual. That is, low activation energy in the on-state current of a transistor indicates that it is easy for carriers to get over the barrier thermally, and the temperature dependence of the on-state current of a transistor is low. For example, when the activation energy in the on-state current is greater than or equal to 0 meV and less than or equal to 25 meV, preferably, greater than or equal to 0 meV and less than or equal to 20 meV, the barrier height which inhibits carrier conduction is sufficiently-low, and it is easy for carriers to get over the barrier thermally; thus, a transistor of which temperature dependence of on-state current is extremely low is obtained, which is preferable.

Hereinafter, description is made, as an example, on two kinds of thin film transistors (hereinafter referred to as TFT-1 and TFT-2) of this embodiment and a thin film transistor (comparative TFT-3) in which an amorphous silicon (a-Si) is used as an active layer as a comparative example.

A method for manufacturing TFTs used for the evaluation is as follows.

(TFT-1)

As the TFT-1, a bottom gate transistor having a channel etched structure in which a channel length (L) was 3 μm and a channel width (W) was 24 μm was manufactured.

First, heat treatment was performed three times on a glass substrate at 650° C. for six minutes with the use of a GRTA apparatus. Next, a silicon nitride layer with a thickness of 100 nm was formed as a base film over the glass substrate by a CVD method, and a silicon oxynitride layer with a thickness of 150 nm was formed over the silicon nitride layer. Subsequently, a tungsten layer with a thickness of 100 nm was formed over the silicon oxynitride layer by a sputtering method as a gate electrode, and then, the tungsten layer was selectively etched to form the gate electrode.

Then, a silicon oxynitride layer with a thickness of 100 nm was formed as a gate insulating film over the gate electrode by a CVD method.

Then, an oxide semiconductor film having a thickness of 30 nm was formed over the gate insulating film by a sputtering method using an In—Ga—Zn—O-based oxide semiconductor target (at a molar ratio of $In_2O_3:Ga_2O_3:ZnO=1:1:1$). Here, an island-shaped oxide semiconductor film was formed by selectively etching the oxide semiconductor film.

Next, first heat treatment was performed on the oxide semiconductor film at 650° C. for 6 minutes in a nitrogen atmosphere by a GRTA apparatus.

Next, as a conductive film for forming a source electrode and a drain electrode, a 100-nm-thick titanium layer, a 200-nm-thick aluminum layer, and a 100-nm-thick titanium layer were stacked over the oxide semiconductor film by a sputtering method. The conductive film was selectively etched to form the source electrode and the drain electrode so that a channel length L and a channel width W of the thin film transistor were 3 μm and 24 μm, respectively.

Then, a silicon oxide layer with a thickness of 300 nm was formed as an insulating film so as to be in contact with the oxide semiconductor film by a sputtering method after heat treatment for 1 hour in a nitrogen atmosphere. Then, an acrylic resin film with a thickness of 1.5 μm was formed as a planarization film. Here, the silicon oxide layer and the planarization film were etched selectively so that openings were formed over the source electrode or the drain electrode. After that, an ITO layer was formed with a thickness of 110 nm as a transparent conductive layer electrically connected to the source electrode or the drain electrode, and heat treatment was performed at 250° C. for 1 hour in a nitrogen atmosphere.

Through the above process, the bottom-gate TFT-1 was manufactured.

(TFT-2)

As the TFT-2, a bottom gate transistor having a channel etched structure in which a channel length (L) was 3 μm and a channel width (W) was 50 μm was manufactured.

A silicon nitride layer with a thickness of 100 nm was formed as a base film over a glass substrate by a CVD method, and a silicon oxynitride layer with a thickness of 150 nm was formed over the silicon nitride layer. Subsequently, a tungsten layer with a thickness of 100 nm was formed as a gate electrode over the silicon oxynitride layer by a sputtering method, and then, the tungsten layer was selectively etched to form the gate electrode.

Then, a silicon oxynitride layer with a thickness of 200 nm was formed as a gate insulating film over the gate electrode by a CVD method.

Then, an oxide semiconductor film having a thickness of 30 nm was formed over the gate insulating film by a sputtering method using an In—Ga—Zn—O-based oxide semiconductor target (at a molar ratio of $In_2O_3:Ga_2O_3:ZnO=1:1:1$). Here, an island-shaped oxide semiconductor film was formed by selectively etching the oxide semiconductor film.

Next, first heat treatment was performed on the oxide semiconductor film at 650° C. for 6 minutes in a nitrogen atmosphere by a GRTA apparatus.

Next, as a conductive film for forming the source electrode and the drain electrode over the oxide semiconductor film, a 100-nm-thick titanium layer, a 200-nm-thick aluminum layer, and a 100-nm-thick titanium layer were stacked over the oxide semiconductor film by a sputtering method. The conductive film was selectively etched to form the source electrode and the drain electrode so that a channel length L and a channel width W of the thin film transistor were 3 μm and 50 μm, respectively.

Then, a silicon oxide layer with a thickness of 300 nm was formed as an insulating film in contact with the oxide semiconductor film by a sputtering method. Then, an acrylic resin film was formed with a thickness of 1.5 μm as a planarization film and second heat treatment is performed at 250° C. for 1 hour in a nitrogen atmosphere. Lastly, an ITO layer was formed with a thickness of 110 nm as a transparent conductive layer electrically connected to the source electrode or the drain electrode.

Through the above process, the bottom-gate TFT-2 was manufactured.

(Comparative TFT-3)

As the comparative TFT-3, a bottom gate transistor having a channel etched structure in which a channel length (L) was 3.7 μm and a channel width (W) was 22 μm was manufactured.

A silicon oxynitride layer with a thickness of 200 nm was formed as a base film over a glass substrate by a CVD method. Subsequently, a 50-nm-thick titanium layer, a 380-nm-thick aluminum layer, and a 120-nm-thick titanium layer were stacked over the silicon oxynitride layer as a gate electrode by a sputtering method, and then the stacked conductive film was selectively etched to form the gate electrode.

Next, a silicon oxynitride layer with a thickness of 200 nm was formed over the gate electrode as a gate insulating film by a CVD method, and then, a semiconductor layer (hereinafter also referred to as an a-Si semiconductor layer) formed by stacked layers of a 205-nm-thick amorphous silicon layer and a 50-nm-thick amorphous silicon layer to which phosphorus was added was formed. The a-Si semiconductor layer was selectively etched to form an island-shaped a-Si semiconductor layer.

Next, as a conductive film for forming a source electrode layer and a drain electrode layer, a 50-nm-thick titanium layer, a 200-nm-thick aluminum layer, and a 50-nm-thick titanium layer were stacked over the a-Si semiconductor layer by a sputtering method. The conductive film was selectively etched to form the source electrode and the drain electrode so that the thin film transistor with a channel length L of 3.7 μm and a channel width W of 22 μm were manufactured.

Subsequently, a silicon nitride layer was formed with a thickness of 300 nm as a protective film by a sputtering method.

Through the above process, the bottom gate comparative TFT-3 was obtained.

Figure 5A:
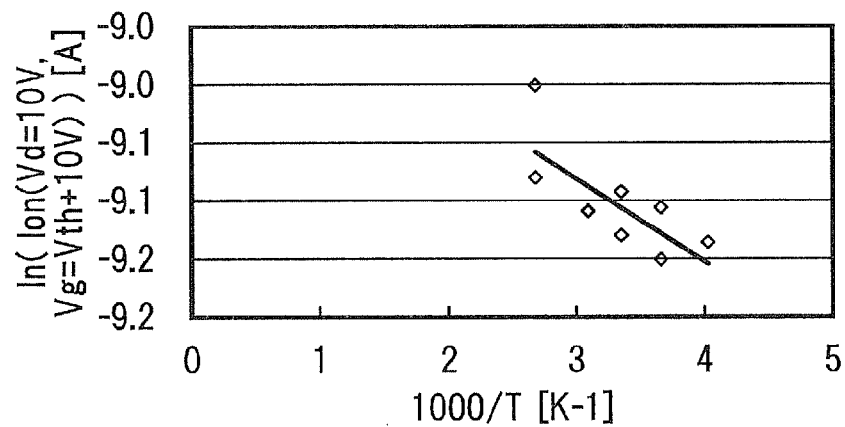
FIGS. 5A to 5C show Arrhenius plots of a transistor including an oxide semiconductor film and a transistor including amorphous silicon.
Figure 5B:
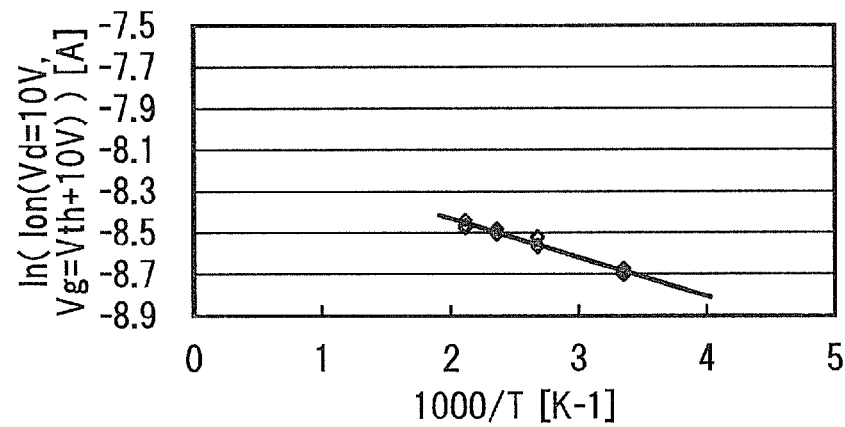
Figure 5C:
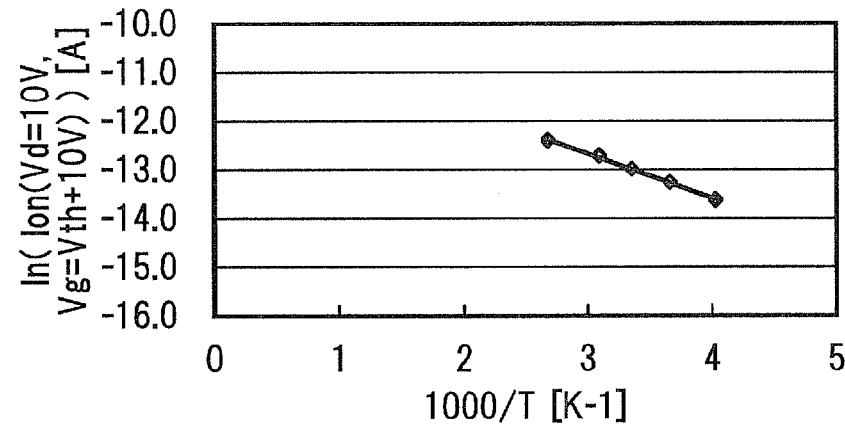

FIGS. 5A to 5C show Arrhenius plots of the TFT-1, the TFT-2, and the comparative TFT-3. FIG. 5A shows an Arrhenius plot of the comparative TFT-3, FIG. 5B shows an Arrhenius plot of the TFT-1, and FIG. 5C shows an Arrhenius plot of the TFT-2. In FIGS. 5A to 5C, the vertical axis indicates a current between the source and the drain (on-state current (Ion) of a TFT) when drain voltage (Vd) is 10V and gate voltage (Vg) is a threshold voltage (Vth) +10V, and the horizontal axis represents an inverse number of the measured absolute temperature.

Figure 6:
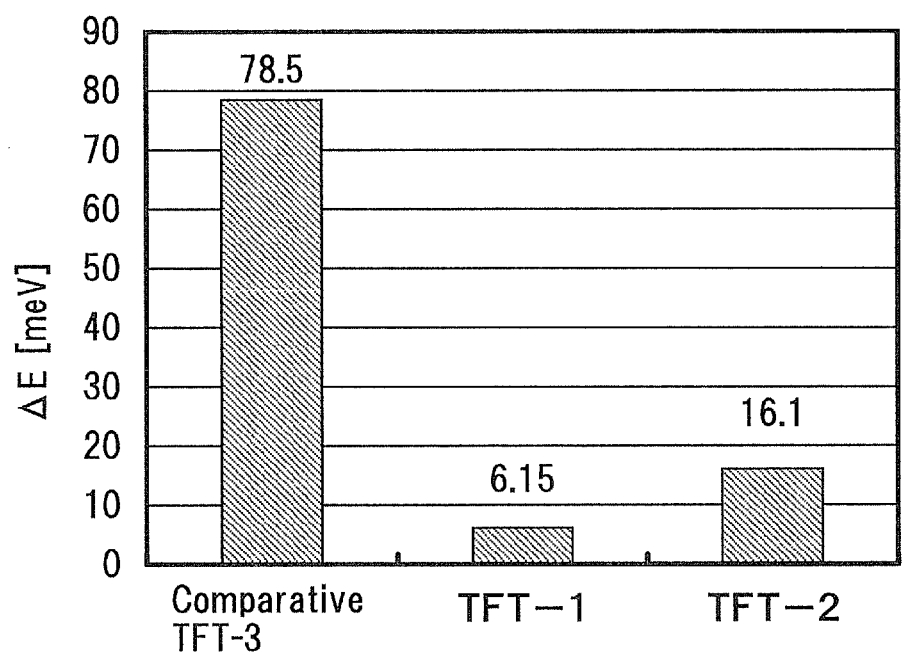
FIG. 6 is a graph showing activation energy of a transistor including an oxide semiconductor film and a transistor including amorphous silicon.

From the slope of a linear approximate expression of the Arrhenius plots shown in FIGS. 5A to 5C, activation energy of each TFT is obtained. FIG. 6 shows activation energy in Ion of each TFT.

From FIG. 6, while the activation energy of the comparative TFT-3 in Ion is 78.5 meV, the activation energy of the TFT-2 of the embodiment of the present invention is 16.1 meV, and that of the TFT-1 of the embodiment of the present invention is 6.15 meV; that is, the activation energy of the TFT-1 and TFT-2 can be significantly decreased. As described above, the low activation energy shows that the temperature dependence of the on-state current of a transistor is low; thus, it can be understood that the transistor of this embodiment is an extremely stable transistor whose on-state current hardly changes with a change in temperature.

(Method for Manufacturing Transistor)

Next, the bottom gate transistor illustrated in FIGS. 1A and 1B is used as an example, and a more detailed structure of a semiconductor device and a manufacturing method thereof will be described with reference to FIGS. 2A to 2E.

Figure 2A:
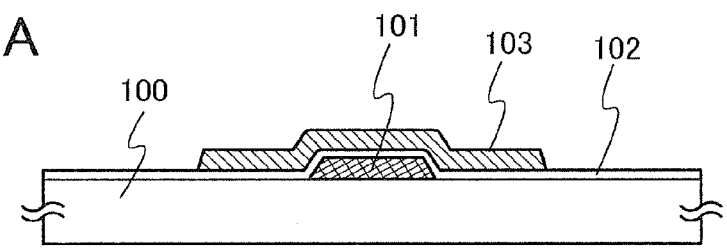
FIGS. 2A to 2E are cross-sectional views illustrating a manufacturing process of a semiconductor device of an embodiment of the present invention.

As illustrated in FIG. 2A, a gate electrode 101 is formed over a substrate 100. As the substrate 100, the following can be used: an alkali-free glass substrate manufactured by a fusion method or a floating method, such as a barium borosilicate glass substrate, an aluminoborosilicate glass substrate, or an aluminosilicate glass substrate; a ceramic substrate; a heat-resistant plastic substrate that can resist process temperature of this manufacturing process; or the like. Alternatively, a metal substrate such as a stainless steel alloy, having a surface provided with an insulating layer, may also be applied.

An insulating film to serve as a base film may be formed between the substrate 100 and the gate electrode 101. As the base film, for example, a single layer of a silicon oxide film, a silicon oxynitride film, a silicon nitride film, a silicon nitride oxide film, an aluminum nitride film, or an aluminum nitride oxide film or a stacked layer of a plurality of these films can be used. In particular, an insulating film having a high barrier property, for example, a silicon nitride film, a silicon nitride oxide film, an aluminum nitride film, or an aluminum nitride oxide film is used for the base film, so that impurities in an atmosphere, such as moisture or hydrogen, or impurities included in the substrate 100, such as an alkali metal or a heavy metal, can be prevented from entering the oxide semiconductor film, the gate insulating film or at the interface between the oxide semiconductor film and another insulating film and the vicinity thereof.

In this specification, oxynitride refers to a substance which includes more oxygen than nitrogen, and nitride oxide refers to a substance which includes more nitrogen than oxygen.

The gate electrode 101 can be formed to have a single-layer structure or a stacked-layer structure using one or more conductive films using a metal material such as molybdenum, titanium, chromium, tantalum, tungsten, neodymium, or scandium; an alloy material which contains any of these metal materials as its main component; or a nitride which contains any of these metals. Note that aluminum or copper can also be used as such metal materials if aluminum or copper can withstand a temperature of heat treatment performed in a later process. Aluminum or copper is preferably used in combination with a refractory metal material in order to avoid problems with heat resistance and corrosion. As the refractory metal material, molybdenum, titanium, chromium, tantalum, tungsten, neodymium, scandium, or the like can be used.

For example, as a two-layer structure of the gate electrode 101, the following structures are preferable: a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, and a two-layer structure in which a titanium nitride film and a molybdenum film are stacked. As a three-layer structure of the gate electrode 101, the following structure is preferable: a stacked structure containing an aluminum film, an alloy film of aluminum and silicon, an alloy film of aluminum and titanium, or an alloy film of aluminum and neodymium in a middle layer and any of a tungsten film, a tungsten nitride film, a titanium nitride film, and a titanium film in a top layer and a bottom layer.

The gate electrode 101 is formed to a thickness of 10 nm to 400 nm, preferably 100 nm to 200 nm. In this embodiment, after a conductive film with a thickness of 100 nm for the gate electrode is formed by a sputtering method using a tungsten target, the conductive film is processed (patterned) by etching to have a desired shape, so that the gate electrode 101 is formed.

Next, a gate insulating film 102 is formed over the gate electrode 101.

The gate insulating film 102 can be formed by a plasma CVD method, a sputtering method, or the like and is preferably formed by deposition treatment using high-density plasma. With high-density plasma, plasma damage to the gate insulating film 102 can be reduced. Accordingly, dangling bonds in the gate insulating film 102 can be reduced and defects can be reduced; thus, the interface with an oxide semiconductor formed later can be highly favorable. It is preferable that the gate insulating film 102 include impurities such as moisture, hydrogen, or oxygen as little as possible.

The gate insulating film 102 can be formed to have a single-layer or stacked-layer structure with use of any of materials such as a silicon oxide film, a silicon nitride film, a silicon oxynitride film, and a silicon nitride oxide film. For example, the gate insulating film 102 including a silicon oxynitride film can be formed using silane and nitrogen monoxide as a deposition gas. The thickness of the gate insulating film 102 is greater than or equal to 10 nm and less than or equal to 500 nm, preferably, greater than or equal to 100 nm and less than or equal to 500 nm. In the case of a stacked-layer structure, for example, a first gate insulating film with a thickness of greater than or equal to 50 nm and less than or equal to 200 nm and a second gate insulating film with a thickness of greater than or equal to 5 nm and less than or equal to 300 nm are stacked in this order.

Further, the gate insulating film 102 can be formed by stacking an oxide film such as a silicon oxide film or a silicon oxynitride film, and a nitride film such as a silicon nitride film or a silicon nitride oxide film in order from the substrate 100 side. Furthermore, the gate insulating film 102 can be formed by stacking a silicon nitride film or a silicon nitride oxide film, a silicon oxide film or a silicon oxynitride film, and a silicon nitride film or a silicon nitride oxide film in order from the substrate 100 side.

In this embodiment, as the gate insulating film 102, a 100-nm-thick silicon oxynitride film is formed by plasma CVD using microwaves of 2.45 GHz as high-density plasma. In this specification, a microwave refers to a wave in the frequency range of 300 MHz to 300 GHz.

Next, an oxide semiconductor film is formed over the gate insulating film 102. The oxide semiconductor film is formed by a sputtering method using an oxide semiconductor target. Moreover, the oxide semiconductor film can be formed under a rare gas (for example, argon) atmosphere, an oxygen atmosphere, or an atmosphere including a rare gas (for example, argon) and oxygen.

Note that before the oxide semiconductor film is formed by a sputtering method, dust attached to a surface of the gate insulating film 102 is preferably removed by reverse sputtering in which an argon gas is introduced and plasma is generated. The reverse sputtering refers to a method in which, without application of a voltage to a target side, an RF power source is used for application of a voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

As the oxide semiconductor film, a four-component metal oxide such as an In—Sn—Ga—Zn—O film; a three-component metal oxide such as an In—Ga—Zn—O film, an In—Sn—Zn—O film, an In—Al—Zn—O film, a Sn—Ga—Zn—O film, an Al—Ga—Zn—O film, or a Sn—Al—Zn—O film; or a two-component metal oxide such as an In—Zn—O film, a Sn—Zn—O film, an Al—Zn—O film, a Zn—Mg—O film, a Sn—Mg—O film, an In—Mg—O film, an In—O film, a Sn—O film, or a Zn—O film can be used. In addition, the above oxide semiconductor film may contain $SiO_2$. Note that in this specification, for example, an In—Sn—Ga—Zn—O film means an oxide film including indium (In), tin (Sn), gallium (Ga), and zinc (Zn), and there is no particular limitation on the stoichiometric proportion.

As the oxide semiconductor film, a thin film represented by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

The thickness of the oxide semiconductor film is set to 10 nm to 300 nm, preferably, 20 nm to 100 nm. In this embodiment, as the oxide semiconductor film, an In—Ga—Zn—O oxide semiconductor film with a thickness of 30 nm, which is obtained with a sputtering method using an oxide semiconductor target including indium (In), gallium (Ga), and zinc (Zn) (e.g., $In_2O_3:Ga_2O_3:ZnO=1:1:1$ or 1:1:2 in a molar ratio), is used. In this embodiment, a DC sputtering method is employed, a flow rate of argon is 30 sccm, a flow rate of oxygen is 15 sccm, and a substrate temperature is a room temperature.

The gate insulating film 102 and the oxide semiconductor film may be formed successively without exposure to air. The successive formation without exposure to air enables an interface between the gate insulating film 102 and the oxide semiconductor film to be formed without being contaminated by atmospheric components or impurity elements floating in the air, such as moisture or hydrocarbon. Thus, variation in characteristics of transistors can be reduced.

Next, as illustrated in FIG. 2A, the oxide semiconductor film is processed (patterned) into a desired shape by etching or the like, whereby an island-shaped oxide semiconductor film 103 is formed over the gate insulating film 102 in a position where the island-shaped oxide semiconductor film 103 overlaps with the gate electrode 101.

Figure 2B:
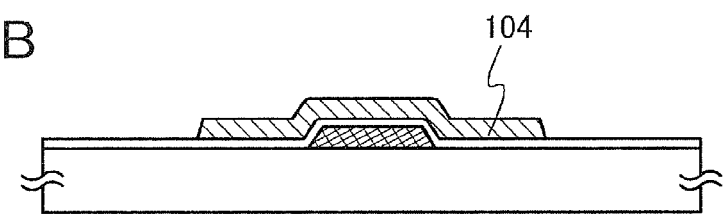

Next, the oxide semiconductor film 103 is subjected to first heat treatment under an inert gas (such as helium, neon, or argon) atmosphere. When the heat treatment is performed on the oxide semiconductor film 103, an oxide semiconductor film 104 in which moisture (including hydroxyl group) or hydrogen is eliminated is formed (FIG. 2B). Specifically, heat treatment is performed in an atmosphere of an inert gas (such as nitrogen, helium, neon, or argon) at a temperature of higher than or equal to 450° C. and lower than or equal to 750° C. (or a temperature lower than or equal to the strain point of the glass substrate) for 1 minute to 10 minutes. Note that heat treatment by a rapid thermal annealing (RTA) method may be performed for this process. Since dehydration or dehydrogenation can be performed in a short time with the RTA method, the first heat treatment can be performed even at a temperature over the strain point of a glass substrate. As the RTA method, a gas rapid thermal annealing (GRTA) method using a heated gas, or a lamp rapid thermal annealing (LRTA) method using lamp light can be given. Note that the heat treatment is not necessarily performed after the island-shaped oxide semiconductor film 103 is formed, and the heat treatment may be performed on the oxide semiconductor film before the island-shaped oxide semiconductor film 103 is formed. The heat treatment may also be performed plural times after the formation of the oxide semiconductor film 103.

Water (including a hydroxyl group), hydrogen, or the like contained in the oxide semiconductor film 103 can be removed by this first heat treatment. Thus, the impurities are reduced, and an i-type or substantially i-type oxide semiconductor film 104 can be formed.

In this embodiment, heat treatment is performed in a nitrogen atmosphere at 650° C. for six minutes in a state where the substrate temperature reaches the set temperature. For example, in the case of performing heat treatment using an electric furnace, the temperature rise characteristics is preferably set at higher than or equal to 0.1° C./min and lower than or equal to 20° C./min and the temperature drop characteristics is preferably set at higher than or equal to 0.1° C./min and lower than or equal to 15° C./min.

Note that it is preferable that in the heat treatment, water, hydrogen, or the like be not contained in nitrogen or a rare gas such as helium, neon, or argon. Alternatively, it is preferable that nitrogen or a rare gas such as helium, neon, or argon introduced into an apparatus for heat treatment have a purity of 6N (99.9999%) or more, preferably, 7N (99.99999%) or more (that is, the impurity concentration is set to 1 ppm or lower, preferably, 0.1 ppm or lower).

Alternatively, the heat treatment may be performed under air where the dew point under an atmospheric pressure is −60° C. or lower and the moisture content is small, instead of an inert gas atmosphere such as a nitrogen atmosphere or a rare gas atmosphere.

The island-shaped oxide semiconductor film 104 which has been subjected to the heat treatment in an inert gas atmosphere is preferably in an amorphous state, but may be partly crystallized.

Figure 2C:
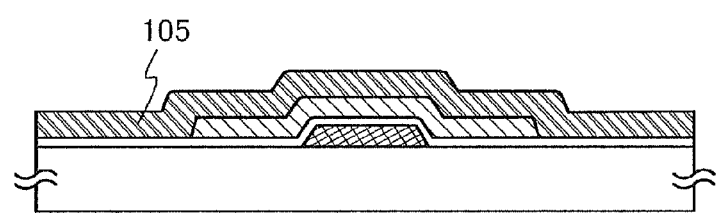

Next, as illustrated in FIG. 2C, a conductive film 105 used for a source electrode and a drain electrode is formed in a single layer or a stacked layer over the island-shaped oxide semiconductor film 104. The conductive film 105 can be formed by a PVD method such as a sputtering method or a CVD method such as a plasma CVD method. The conductive film 105 can be formed using an element selected from titanium, magnesium, yttrium, aluminum, tungsten, and molybdenum, an alloy including any of the above elements as a component, or the like. Further, a light-transmitting oxide conductive film of indium oxide, an indium oxide-tin oxide alloy, an indium oxide-zinc oxide alloy, zinc oxide, zinc aluminum oxide, zinc aluminum oxynitride, zinc gallium oxide, or the like may be used. By using the light-transmitting oxide conductive film, the aperture ratio of a pixel can be increased.

Note that the thickness of the conductive film 105 may be 100 nm to 500 nm. In this embodiment, a 100-nm-thick titanium film formed by a sputtering method, a 200-nm-thick aluminum film formed by a sputtering method, and a 100-nm-thick titanium film formed by a sputtering method are stacked over the oxide semiconductor film 104 in this order, whereby the conductive film 105 having a stacked-layer structure of three layers is formed.

Figure 2D:
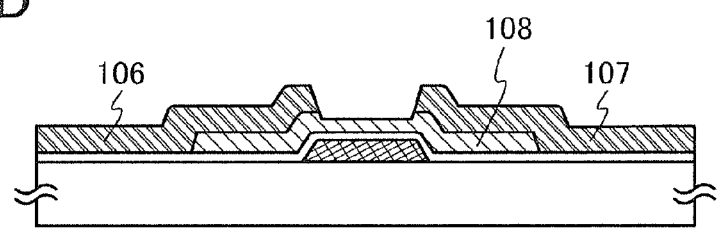

Next, as illustrated in FIG. 2D, the conductive film 105 is processed (patterned) into a desired shape by etching or the like, so that a source electrode 106 and a drain electrode 107 are formed.

In order to prevent the island-shaped oxide semiconductor film 104 from being removed at the time of the etching of the conductive film 105, materials and etching conditions of the conductive film 105 and the oxide semiconductor film 104 are adjusted as appropriate. Depending on the materials and etching conditions, in the patterning for forming the source electrode 106 and the drain electrode 107, an exposed portion of the island-shaped oxide semiconductor film 104 is partly etched, so that an island-shaped oxide semiconductor film 108 having a groove (a recessed portion) is formed in some cases.

Figure 2E:
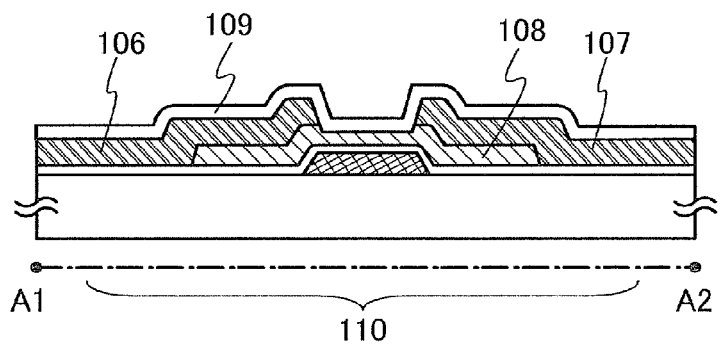

After the source electrode 106 and the drain electrode 107 are formed, an insulating film 109 is formed so as to cover the source electrode 106, the drain electrode 107, and the oxide semiconductor film 108 (FIG. 2E). The insulating film 109 preferably includes impurities such as moisture or hydrogen as little as possible, and the insulating film 109 may be formed using a single-layer insulating film or a plurality of insulating films stacked. In the case of using the plurality of insulating films stacked, it is preferable that an insulating film such as a silicon oxide film, a silicon nitride film, a silicon oxynitride film, a silicon nitride oxide film, an aluminum oxide film, a hafnium oxide film, or a tantalum oxide film be formed to be in contact with the oxide semiconductor film 108, and then, an insulating film having higher proportion of nitrogen than the aforementioned insulating film, which has a high barrier property, such as a silicon nitride film, a silicon nitride oxide film, an aluminum nitride film, or an aluminum nitride oxide film be formed. By using the insulating film having a high barrier property, the impurities such as moisture or hydrogen can be prevented from entering the oxide semiconductor film 108, the gate insulating film 102, or the interface between the oxide semiconductor film 108 and another insulating film and the vicinity thereof. In addition, the insulating film having lower proportion of nitrogen such as a silicon oxide film or a silicon oxynitride film is formed so as to be in contact with the oxide semiconductor film 108, so that the insulating film formed using a material having a high barrier property can be prevented from being in contact with the oxide semiconductor film 108 directly. The substrate temperature at the time of deposition is in the range of room temperature to 300° C.

Note that the film thickness of the insulating film 109 is not particularly limited; for example, greater than or equal to 10 nm and less than or equal to 500 nm, preferably greater than or equal to 50 nm and less than or equal to 200 nm.

In this embodiment, a silicon oxide film with a thickness of 300 nm is formed by a sputtering method as the insulating film 109. The formation of the silicon oxide film by a sputtering method can be performed in a rare gas (typically argon) atmosphere, an oxygen atmosphere, or an atmosphere of a rare gas (typically argon) and oxygen. As a target, a silicon oxide target or a silicon target may be used. For example, with use of a silicon target, a silicon oxide film can be formed by a sputtering method in an atmosphere of oxygen and a rare gas.

Next, second heat treatment is performed in an atmosphere of an inert gas (such as nitrogen, helium, neon, or argon) preferably at a temperature of higher than or equal to 200° C. and lower than or equal to 400° C., for example, higher than or equal to 250° C. and lower than or equal to 350° C. For example, the second heat treatment is performed in a nitrogen atmosphere at 250° C. for one hour. Alternatively, RTA treatment may be performed at high temperature for a short time as in the first heat treatment. By the second heat treatment, the oxide semiconductor film 108 is heated while being in contact with an oxide which forms the insulating film 109, oxygen is supplied to the oxide semiconductor film 108 whose resistance is reduced by the first heat treatment, and an oxygen-deficient portion is repaired, whereby the oxide semiconductor film 108 can have high resistance (become i-type). Therefore, electric characteristics of transistors can be improved and variations in the electric characteristics can be reduced. The heat treatment can be performed at any time after the insulating film 109 is formed. When the heat treatment also serves as another step, the number of steps is not increased.

This heat treatment may be performed at a fixed heating temperature. Alternatively, the following change in the heating temperature may be conducted plural times repeatedly: the heating temperature is increased from a room temperature to a temperature of 100° C. to 200° C. and then decreased to a room temperature. Further, this heat treatment may be performed before formation of the insulating film 109 under a reduced pressure. Under the reduced pressure, the heat treatment time can be shortened. With this heat treatment, a normally-off transistor can be obtained. Therefore, reliability of the semiconductor device can be improved.

Through the above-described process, the transistor 110 including the oxide semiconductor film 108 in which the concentration of hydrogen, moisture, a hydroxyl group, or hydride is reduced can be formed (see FIG. 10E).

Note that, not shown in the figure, after a conductive film is formed over the insulating film 109, the conductive film is patterned, so that a back gate electrode may be formed so as to overlap with the oxide semiconductor film 108. The back gate electrode can be formed using a material and a structure which are similar to those of the gate electrode 101 or the source electrode 106 and the drain electrode 107. The thickness of the back gate electrode is set to 10 nm to 400 nm, preferably 100 nm to 200 nm.

Further, the back gate electrode may be electrically insulated in a floating state, or may be in a state where the back gate electrode is supplied with a potential. In the latter case, the back gate electrode may be supplied with the same potential as the gate electrode 101, or may be supplied with a fixed potential such as a ground potential. The level of the potential applied to the back gate electrode 111 is controlled, so that the threshold voltage of the transistor 110 can be controlled.

By the manufacturing method according to the embodiment described above, a highly reliable transistor in which the activation energy in on-state current is greater than or equal to 0 meV and less than or equal to 25 meV, preferably, greater than or equal to 0 meV and less than or equal to 20 meV can be obtained. In addition, in the transistor of this embodiment, off-state current of $10^{-13}$ A or less, which is an excellent electric characteristics can be obtained. As described above, the oxide semiconductor is purified so that impurities in the oxide semiconductor are contained as little as possible, whereby favorable operation of the transistor can be obtained. Furthermore, a transistor whose temperature dependence is low and which can stably operate even at high temperature or low temperature can be formed.

Figure 3A:
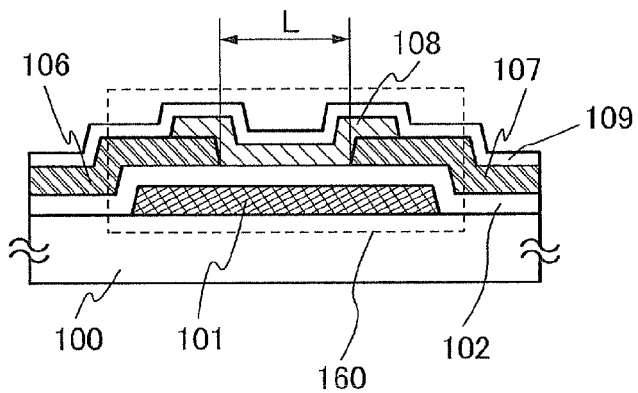
FIGS. 3A to 3C are cross-sectional views each illustrating a semiconductor device of an embodiment of the present invention.
Figure 3B:
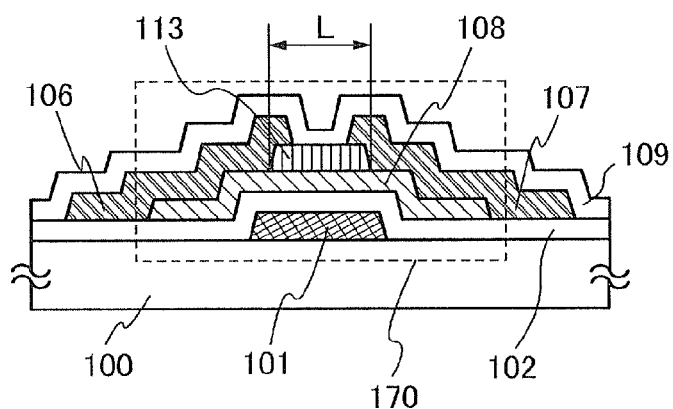
Figure 3C:
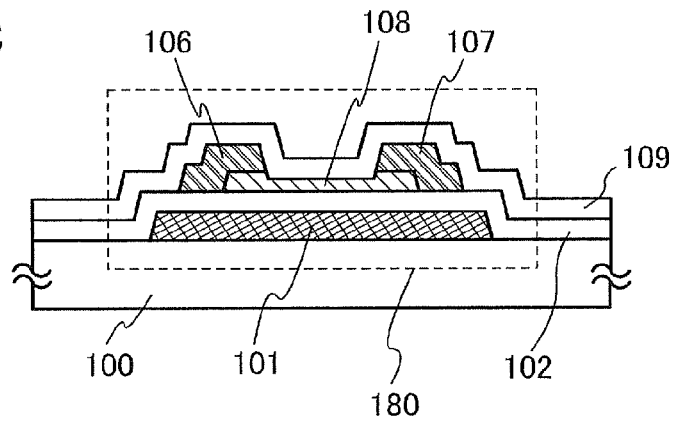

Although a method for manufacturing the bottom-gate transistor 110 is described in this embodiment, the structure of this embodiment is not limited thereto. A bottom-contact (also referred to as an inverted-coplanar) transistor 160 having a bottom-gate structure as illustrated in FIG. 3A, a channel-protective (also referred to as a channel-step) transistor 170 including a channel protective layer 113 as illustrated in FIG. 3B, and the like can be formed using the same materials and the same method. FIG. 3C illustrates an example which shows a channel-etched type transistor being different from the transistor illustrated in FIG. 2E. A transistor 180 illustrated in FIG. 3C has a structure in which the gate electrode layer 101 extends to an outer side beyond an edge portion of the oxide semiconductor layer 108.

Note that the channel length (L in FIG. 1B) of the transistor is defined as a distance between the source electrode 106 and the drain electrode 107, and the channel length L of the channel-protective transistor is defined as a width of the channel protective layer (L in FIG. 3B) in a direction parallel to a carrier flow direction. Note that the channel protective layer 113 can be formed using the same material and the method as those used to form the insulating film 109. By providing the channel protective layer 113 over a channel formation region, damage to the channel formation region of the oxide semiconductor film (e.g., reduction in thickness due to plasma or an etchant in etching) can be prevented in the manufacturing process, whereby reliability of the transistor can be further improved.

The transistors illustrated in FIGS. 3A to 3C can be formed by the manufacturing process similar to that in FIGS. 2A to 2E. That is, hydrogen that is an n-type impurity is removed from an oxide semiconductor by the first heat treatment and oxygen is introduced into the oxygen-deficient portion by the second heat treatment so that the oxide semiconductor is highly purified such that impurities that are not main components of the oxide semiconductor are contained as to be an intrinsic (i-type) or substantially intrinsic oxide semiconductor.

In the transistor described in this embodiment, a purified i-type (intrinsic) semiconductor or a semiconductor close thereto is obtained not by adding impurities but by removing impurities such as hydrogen or water as much as possible. By highly purifying the oxide semiconductor film, the threshold voltage of the transistor can be positive, and a so-called normally-off transistor can be realized.

As described above, by using an oxide semiconductor which is made to be an i-type or substantially i-type oxide semiconductor (for example, carrier density is less than $1\times10^{12}/cm^3$, preferably, less than $1.45\times10^{10}/cm^3$), a transistor which has extremely favorable off-state current characteristics can be obtained. Further, a transistor whose activation energy obtained from temperature dependence of on-state current is extremely low can be obtained This embodiment can be implemented in combination with any of the other embodiments, as appropriate.

Embodiment 2

The transistor described in Embodiments 1 is manufactured, and a semiconductor device having a display function (also referred to as a display device) can be manufactured using the transistor for a pixel portion and further for a driver circuit. Further, part or whole of a driver circuit can be formed over the same substrate as a pixel portion, using the transistor described in Embodiments 1, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an organic electroluminescent (EL) element, an inorganic EL element, and the like. Furthermore, a display medium whose contrast is changed by an electric effect, such as electronic ink, can be used.

In addition, the display device includes a panel in which the display element is sealed, and a module in which an IC and the like including a controller are mounted on the panel. Furthermore, an element substrate, which corresponds to one embodiment before the display element is completed in a manufacturing process of the display device, is provided with a means for supplying a current to the display element in each of a plurality of pixels. Specifically, the element substrate may be in a state in which only a pixel electrode of the display element is formed, a state after a conductive film to be a pixel electrode is formed and before the conductive film is etched to form the pixel electrode, or any of other states.

Note that, the "display device" includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

In this embodiment, the appearance and a cross section of a liquid crystal display panel which is one embodiment of a semiconductor device will be described with reference to FIGS. 11A1, 11A2, and 11B. FIGS. 11A1 and 11A2 are top views of panels, in which highly reliable transistors 4010 and 4011 each including an In—Ga—Zn—O-based film as an oxide semiconductor film described in Embodiment 1 and a liquid crystal element 4013 are sealed between a first substrate 4001 and a second substrate 4006 with a sealant 4005. FIG. 11B is a cross-sectional view taken along M-N in FIGS. 11A1 and 11A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 11A1 illustrates an example of mounting the signal line driver circuit 4003 by a COG method, and FIG. 11A2 illustrates an example of mounting the signal line driver circuit 4003 by a TAB method.

The pixel portion 4002 and the scan line driver circuit 4004 provided over the first substrate 4001 include a plurality of transistors. FIG. 11B illustrates the transistor 4010 included in the pixel portion 4002 and the transistor 4011 included in the scan line driver circuit 4004, as an example. Insulating layers 4020 and 4021 are provided over the transistor 4010, and the transistor 4011.

Conductive layers 4042 and 4043 may be provided over part of the insulating layer 4020 so as to overlap with channel formation regions of the oxide semiconductor films in the transistor 4010 for the pixel portion and the transistor 4011 in a driver circuit portion, respectively. The conductive layers 4042 and 4043 are provided at the positions overlapping with the channel formation regions of the oxide semiconductor films, whereby the amount of change in threshold voltage of the transistors 4010 and 4011 between before and after the BT test can be reduced. Potentials of the conductive layers 4042 and 4043 may be the same as or different from those of gate electrodes of the transistors 4010 and 4011. The conductive layers 4042 and 4043 can also function as a second gate electrode. Further, the potentials of the conductive layers 4042 and 4043 may be GND or 0 V, or the conductive layers 4042 and 4043 may be in a floating state. The conductive layers 4042 and 4043 can be formed using the same material as that of the gate electrode of the transistors 4010 and 4011.

As the transistors 4010 and 4011, highly reliable transistors described in Embodiment 1, each of which includes an In—Ga—Zn—O-based film as an oxide semiconductor film, can be employed. In this embodiment, the transistors 4010 and 4011 are n-channel transistors.

A pixel electrode layer 4030 included in the liquid crystal element 4013 is electrically connected to the transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is provided between the electrode layers with the insulating layers 4032 and 4033 interposed therebetween. Although not illustrated, a color filter may be provided either on the first substrate 4001 side or on the second substrate 4006 side.

Note that the first substrate 4001 and the second substrate 4006 can be formed of glass, metal (typically, stainless steel), ceramics, or plastics. As plastics, a fiberglass-reinforced plastics (FRP) plate, a polyvinyl fluoride (PVF) film, a polyester film, or an acrylic resin film can be used. Alternatively, a sheet having a structure in which an aluminum foil is arranged between PVF films or polyester films can be used.

Reference numeral 4035 is a columnar spacer obtained by selective etching of an insulating film and provided in order to control the distance (a cell gap) between the pixel electrode layer 4030 and the counter electrode layer 4031. Alternatively, a spherical spacer may be used. The counter electrode layer 4031 is electrically connected to a common potential line formed over the substrate where the transistor 4010 is formed. The counter electrode layer 4031 and the common potential line can be electrically connected to each other through conductive particles provided between the pair of substrates using common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase is only generated within a narrow range of temperature, a liquid crystal composition containing a chiral agent at 5 wt % or more is used for the liquid crystal layer 4008 in order to improve the temperature range. The liquid crystal composition including liquid crystal exhibiting a blue phase and a chiral agent has a short response time of 10 μsec to 100 μsec inclusive and is optically isotropic; therefore, alignment treatment is not necessary and viewing angle dependence is small.

Note that although this embodiment shows an example of a transmissive liquid crystal display device, the present invention can also be applied to a reflective liquid crystal display device or a semi-transmissive liquid crystal display device.

While an example of the liquid crystal display device in which a polarizing plate is provided on the outer side of the substrate (on the viewer side) and the coloring layer and the electrode layer used for a display element are provided on the inner side of the substrate in that order is described in this embodiment, the polarizing plate may be provided on the inner side of the substrate. The stacked structure of the polarizing plate and the coloring layer is not limited to this embodiment and may be set as appropriate depending on materials of the polarizing plate and the coloring layer or conditions of manufacturing process. Further, a light-blocking film serving as a black matrix may be provided.

In this embodiment, in order to reduce surface unevenness of the thin film transistor and to improve reliability of the thin film transistor, the thin film transistor obtained in Embodiment 1 is covered with the insulating layers (the insulating layer 4020 and the insulating layer 4021) functioning as a protective film or a planarizing insulating film. Note that the protective film is provided to prevent entry of contaminant impurities such as organic substance, metal, or moisture existing in air and is preferably a dense film. The protective film may be formed with a single layer or a stacked layer of a silicon oxide film, a silicon nitride film, a silicon oxynitride film, a silicon nitride oxide film, an aluminum oxide film, an aluminum nitride film, aluminum oxynitride film, and/or an aluminum nitride oxide film by a sputtering method. Although an example in which the protective film is formed by a sputtering method is described in this embodiment, the present invention is not limited to this method and a variety of methods may be employed.

In this embodiment, the insulating layer 4020 having a stacked-layer structure is formed as a protective film. Here, a silicon oxide film is formed by a sputtering method, as a first layer of the insulating layer 4020. The use of a silicon oxide film as a protective film has an effect of preventing hillock of an aluminum film which is used as the source and drain electrode layers.

As a second layer of the protective film, an insulating layer is formed. Here, a silicon nitride film is formed by a sputtering method, as a second layer of the insulating layer 4020. The use of the silicon nitride film as the protective film can prevent mobile ions such as sodium ions from entering a semiconductor region, thereby suppressing changes in electric characteristics of the TFT.

After the protective film is formed, annealing (higher than or equal to 300° C. and lower than or equal to 400° C.) of the oxide semiconductor film may be performed.

The insulating layer 4021 is formed as the planarizing insulating film. The insulating layer 4021 can be formed using a heat-resistant organic material such as acrylic, polyimide, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

Note that the siloxane-based resin corresponds to a resin including a Si—O—Si bond formed using a siloxane-based material as a starting material. A siloxane-based resin may include, as a substituent, an organic group (e.g., an alkyl group or an aryl group) or a fluoro group. In addition, the organic group may include a fluoro group.

The formation method of the insulating layer 4021 is not limited to a particular method, and the insulating layer 4021 can be formed, depending on the material, by a sputtering method, an SOG method, spin coating, dipping, spray coating, a droplet discharge method (such as an inkjet method, screen printing, or offset printing), or with a tool such as a doctor knife, a roll coater, a curtain coater, or a knife coater. In the case of forming the insulating layer 4021 with the use of a liquid material, annealing (higher than or equal to 300° C. and lower than or equal to 400° C.) of the oxide semiconductor film may be performed at the same time as a baking step. The baking step of the insulating layer 4021 also serves as the annealing of the oxide semiconductor film, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

In this embodiment, a connection terminal electrode 4015 is formed using the same conductive film that is used for the pixel electrode layer 4030 included in the liquid crystal element 4013, and a terminal electrode 4016 is formed using the same conductive film that is used for the source and drain electrode layers of the transistors 4010 and 4011.

The connection terminal electrode 4015 is electrically connected to a terminal included in the FPC 4018 via an anisotropic conductive film 4019.

FIGS. 11A1, 11A2, and 11B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 12:
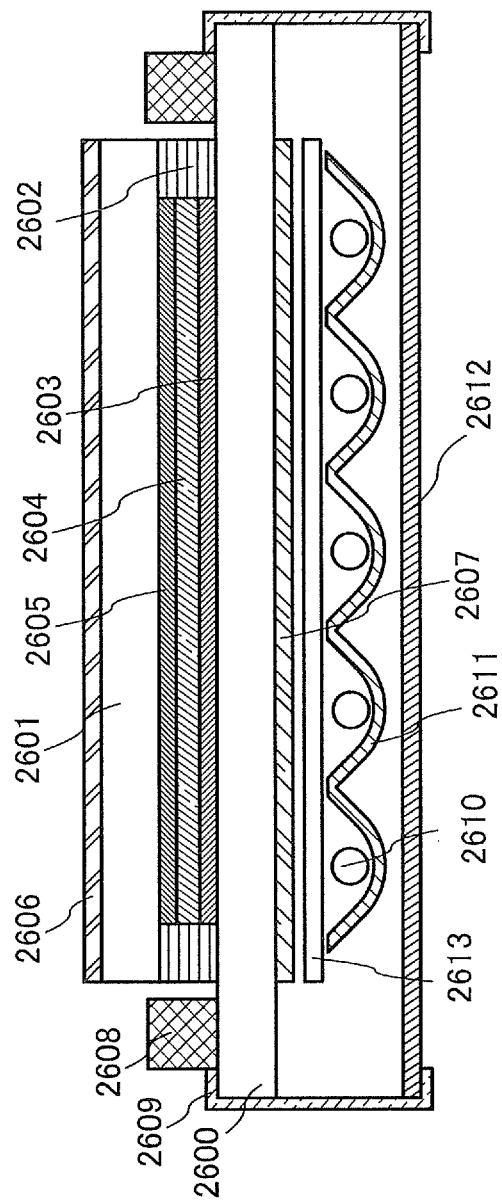
FIG. 12 is a cross-sectional view illustrating an embodiment of the present invention.

FIG. 12 illustrates an example in which a liquid crystal display module is formed as a semiconductor device by using a TFT substrate 2600 manufactured by application of the TFT described in Embodiments 1.

FIG. 12 illustrates an example of a liquid crystal display module, in which, to form a display region, the TFT substrate 2600 and a counter substrate 2601 are fixed to each other with a sealant 2602; a pixel portion 2603 including a TFT or the like, a display element 2604 including a liquid crystal layer, and a coloring layer 2605 are provided between the substrates. In addition, over the counter substrate 2601 (opposite to the TFT substrate 2600), a polarizing plate 2606 is provided to form the display region. The coloring layer 2605 is necessary to perform color display. In the RGB system, respective coloring layers corresponding to colors of red, green, and blue are provided for respective pixels. A polarizing plate 2607 and a diffusion plate 2613 are provided outside the TFT substrate 2600. The polarizing plate 2606 is provided outside the counter substrate 2601. A light source includes a cold cathode tube 2610 and a reflective plate 2611, and a circuit substrate 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Through the above process, a highly reliable liquid crystal display panel as a semiconductor device can be manufactured. Because a transistor in which stable characteristics can be obtained in a wide temperature range as described in Embodiment 1 is used, a liquid crystal display panel obtained in this embodiment can be used in the wide temperature range, and can be preferably used for an in-car display device, for example.

Note that the structure described in this embodiment can be combined with any of the structures described in other embodiments as appropriate.

Embodiment 3

In this embodiment, an example of electronic paper is described as a semiconductor device in which the transistor described in Embodiment 1 is used.

Figure 13:
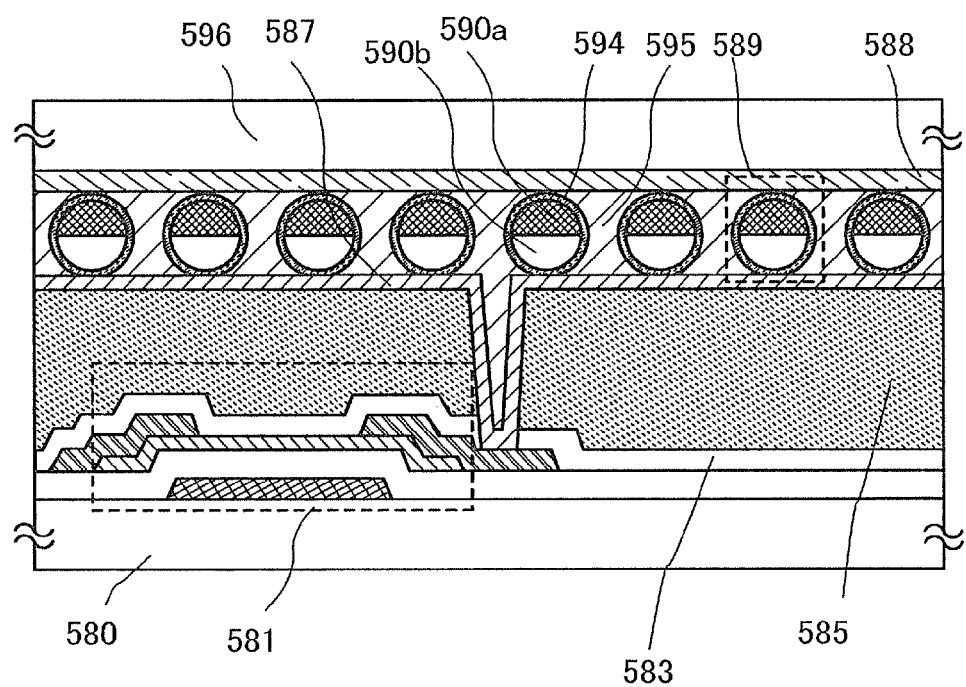
FIG. 13 is a cross-sectional view illustrating an embodiment of the present invention.

FIG. 13 illustrates active matrix electronic paper as an example of a semiconductor device. The transistor described in Embodiment 1 can be used as a transistor 581 for the semiconductor device.

The electronic paper in FIG. 13 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The transistor 581 has a bottom-gate structure in which a source electrode layer or a drain electrode layer of the transistor 581 is electrically connected to a first electrode layer 587 in an opening formed in an insulating layer 585. Between the first electrode layer 587 and the second electrode layer 588, spherical particles 589 are provided. Each spherical particle 589 includes a black region 590a and a white region 590b, and a cavity 594 filled with liquid around the black region 590a and the white region 590b. The spherical particles 589 are surrounded by filler 595 such as a resin. In this embodiment, the first electrode layer 587 corresponds to a pixel electrode, and the second electrode layer 588 corresponds to a common electrode. The second electrode layer 588 is electrically connected to a common potential line provided over the same substrate as the transistor 581. With the use of a common connection portion, the second electrode layer 588 can be electrically connected to the common potential line through conductive particles provided between a pair of substrates.

Further, instead of the twisting ball, an electrophoretic element can also be used. A microcapsule having a diameter of approximately greater than or equal to 10 µm and less than or equal to 200 µm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is generally called electronic paper. The electrophoretic display element has a higher reflectivity than a liquid crystal display element and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, a highly reliable electronic paper as a semiconductor device can be manufactured.

Note that the structure described in this embodiment can be combined with any of the structures described in other embodiments as appropriate.

Embodiment 4

In this embodiment, an example of a light-emitting display device will be described as a semiconductor device in which the transistor described in Embodiments 1 is used. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 14:
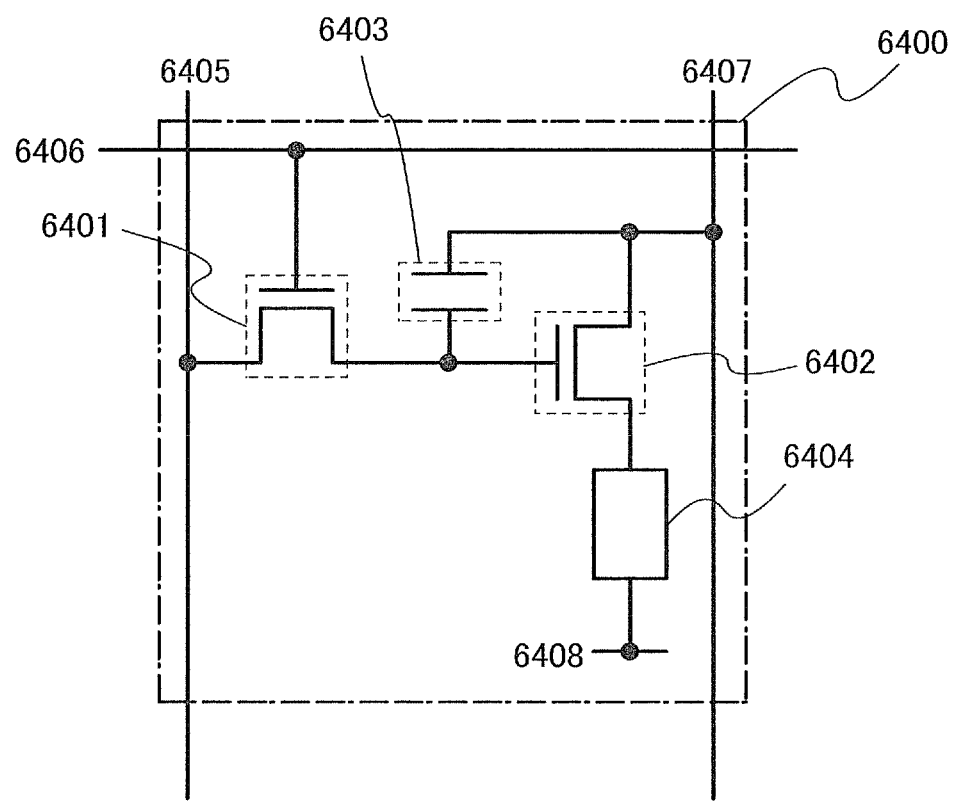
FIG. 14 illustrates an equivalent circuit of a pixel of a semiconductor device.

FIG. 14 illustrates an example of a pixel structure in which digital time grayscale driving can be used, as an example of a semiconductor device to which an embodiment of the present invention is applied. In the case of performing digital time grayscale driving, high-speed switching is required. For that reason, a thin film transistor using amorphous silicon can not be used. However, field effect mobility of an In—Ga—Zn—O based oxide semiconductor film is greater than or equal to 10 cm$^2$/Vs, which is desirable for the purpose.

A structure and operation of a pixel to which digital time grayscale driving can be applied are described. Here, an example is described here in which one pixel includes two n-channel transistors described in Embodiment 1, in each of which an oxide semiconductor layer (an In—Ga—Zn—O-based film) is used in a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate. The connection portion may be used as a common connection portion.

The second electrode (common electrode 6408) of the light-emitting element 6404 is set to a low power supply potential. Note that the low power supply potential is a potential satisfying the low power supply potential<a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher of the light-emitting element 6404.

Note that gate capacitor of the driver transistor 6402 may be used as a substitute for the capacitor 6403, so that the capacitor 6403 can be omitted. Display performance is not adversely affected in many cases even if the capacitor 6403 is not provided because the transistor with an extremely small off-state current as described in Embodiment 1 is particularly used. The gate capacitor of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on or turned off. That is, the driver transistor 6402 operates in a linear region. Since the driver transistor 6402 operates in the linear region, a voltage higher than the voltage of the power supply line 6407 is applied to the gate of the driver transistor 6402. Note that a voltage higher than or equal to (voltage of the power supply line+Vth of the driver transistor 6402) is applied to the signal line 6405.

In the case of performing analog grayscale driving instead of digital time grayscale driving, the same pixel configuration as FIG. 14 can be used by changing signal input.

In the case of performing analog grayscale driving, a voltage higher than or equal to (forward voltage of the light-emitting element 6404+Vth of the driver transistor 6402) is applied to the gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure is not limited to that illustrated in FIG. 14. For example, a switch, a resistive element, a capacitor element, a transistor, a logic circuit, or the like may be added to the pixel illustrated in FIG. 14.

Next, structures of the light-emitting element will be described with reference to FIGS. 15A to 15C. Here, the case where a driving transistor is an n-channel transistor is illustrated, and cross-sectional structures of pixels are described. Driver transistors 7001, 7011, and 7021 used for semiconductor devices illustrated in FIGS. 15A to 15C can be manufactured in a manner similar to that of the transistor described in Embodiment 1 and are highly reliable transistors each including an In—Ga—Zn—O-based film as an oxide semiconductor film.

In order to extract light emitted from the light-emitting element, at least one of an anode and a cathode is required to transmit light. A transistor and a light-emitting element are formed over a substrate. There are light-emitting elements having a top emission structure in which light is extracted through the surface opposite to the substrate, a bottom emission structure in which light is extracted through the surface on the substrate side, and a dual emission structure in which light is extracted through the surface on the substrate side and the surface opposite to the substrate. The pixel configuration of the present invention can be applied to a light emitting element having any emission structure.

Next, a light-emitting element having a bottom emission structure will be described with reference to FIG. 15A.

Figure 15A:
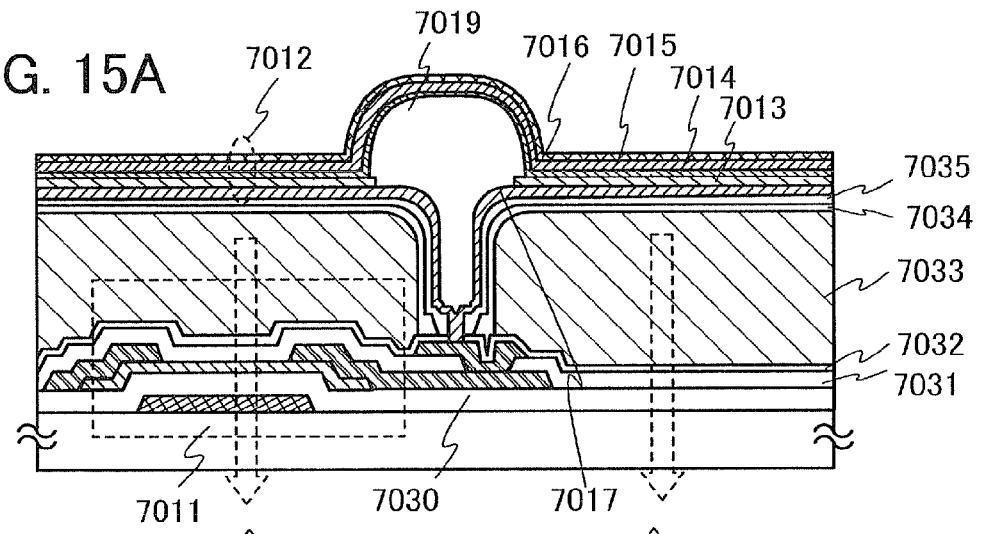
FIGS. 15A to 15C are cross-sectional views each illustrating an embodiment of the present invention.

FIG. 15A is a cross-sectional view of a pixel in the case where the driver transistor 7011 is of an n-type and light is emitted from a light-emitting element 7012 to a first electrode 7013 side. In FIG. 15A, the first electrode 7013 of the light-emitting element 7012 is formed over a light-transmitting conductive film 7017 which is electrically connected to the drain electrode layer of the driver transistor 7011, and an EL layer 7014 and a second electrode 7015 are stacked in order over the first electrode 7013.

As the light-transmitting conductive film 7017, a light-transmitting conductive film of, for example, indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

Any of a variety of materials can be used for the first electrode 7013 of the light-emitting element. For example, in the case where the first electrode 7013 is used as a cathode, the first electrode 7013 is preferably formed using, for example, a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In FIG. 15A, the first electrode 7013 is formed to have a thickness enough to transmit light (preferably, approximately 5 nm to 30 nm). For example, an aluminum film having a thickness of 20 nm is used for the first electrode 7013.

Note that the light-transmitting conductive film 7017 and the first electrode 7013 may be formed by stacking a light-transmitting conductive film and an aluminum film and then performing selective etching. In this case, the etching can be performed using the same mask, which is preferable.

Further, the periphery of the first electrode 7013 is covered with a partition wall 7019. The partition 7019 is formed using an organic resin film of polyimide, acrylic, polyamide, epoxy, or the like, an inorganic insulating film, or organic polysiloxane. It is particularly preferable that the partition wall 7019 be formed using a photosensitive resin material to have an opening over the first electrode 7013 so that a sidewall of the opening is formed to have an inclined surface with continuous curvature. In the case where a photosensitive resin material is used for the partition 7019, a step of forming a resist mask can be omitted.

As the EL layer 7014 formed over the first electrode 7013 and the partition wall 7019, an EL layer including at least a light-emitting layer is acceptable. Further, the EL layer 7014 may be formed to have either a single-layer structure or a stacked-layer structure. When the EL layer 7014 is formed using a plurality of layers, an electron-injection layer, an electron-transport layer, a light-emitting layer, a hole-transport layer, and a hole-injection layer are stacked in this order over the first electrode 7013 functioning as a cathode. It is not necessary to form all of these layers.

The stacking order is not limited to the above order. The first electrode 7013 may serve as an anode, and a hole-injection layer, a hole-transport layer, a light-emitting layer, an electron-transport layer, and an electron-injection layer may be stacked in the order over the first electrode 7013. However, considering power consumption, it is preferable that the first electrode 7013 serve as a cathode and an electron-injection layer, an electron-transport layer, a light-emitting layer, a hole-transport layer, and a hole-injection layer be stacked in the order over the first electrode 7013 because an increase in voltage of a driver circuit portion can be prevented and power consumption can be reduced more effectively.

Further, any of a variety of materials can be used for the second electrode 7015 formed over the EL layer 7014. For example, in the case where the second electrode 7015 is used as an anode, a material having a high work function, for example, ZrN, Ti, W, Ni, Pt, Cr, or the like; or a transparent conductive material such as ITO, IZO, or ZnO is preferable. Further, a shielding film 7016, for example, a metal which blocks light, a metal which reflects light, or the like is provided over the second electrode 7015. In this embodiment, an ITO film is used as the second electrode 7015, and a Ti film is used as the shielding film 7016.

The light-emitting element 7012 corresponds to a region where the EL layer 7014 including the light-emitting layer is sandwiched between the first electrode 7013 and the second electrode 7015. In the case of the element structure illustrated in FIG. 15A, light is emitted from the light-emitting element 7012 to the first electrode 7013 side as indicated by an arrow.

Note that in FIG. 15A, light emitted from the light-emitting element 7012 passes through a color filter layer 7033, an insulating layer 7032, an oxide insulating layer 7031, a gate insulating layer 7030, and a substrate 7010 to be emitted.

The color filter layer 7033 is formed by a droplet discharge method such as an inkjet method, a printing method, an etching method with the use of a photolithography technique, or the like.

The color filter layer 7033 is covered with the overcoat layer 7034, and also covered with the protective insulating layer 7035. Although the overcoat layer 7034 is illustrated to have a small thickness in FIG. 15A, the overcoat layer 7034 has a function of reducing unevenness caused by the color filter layer 7033 with the use of a resin material such as an acrylic resin.

A contact hole which is formed in the protective insulating layer 7035 and the insulating layer 7032 and reaches the drain electrode layer is provided in a portion which overlaps with the partition wall 7019.

Next, a light-emitting element having a dual emission structure will be described with reference to FIG. 15B.

Figure 15B:
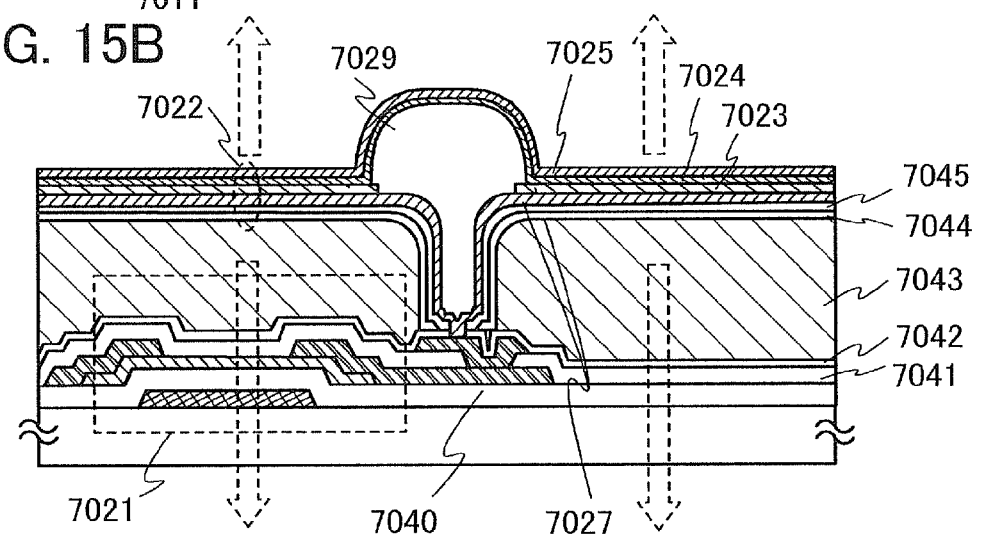

In FIG. 15B, a first electrode 7023 of a light-emitting element 7022 is formed over a light-transmitting conductive film 7027 which is electrically connected to the drain electrode layer of the driver transistor 7021, and an EL layer 7024 and a second electrode 7025 are stacked in that order over the first electrode 7023.

As the light-transmitting conductive film 7027, a light-transmitting conductive film such as a film of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added can be used.

Any of a variety of materials can be used for the first electrode 7023. For example, in the case where the first electrode 7023 is used as a cathode, the first electrode 7023 is preferably formed using, for example, a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In this embodiment, the first electrode 7023 is used as a cathode, and the first electrode 7023 is approximately formed to a thickness such that light is transmitted (preferably, approximately 5 nm to 30 nm). For example, an aluminum film having a thickness of 20 nm is used as the cathode.

Note that the light-transmitting conductive film 7027 and the first electrode 7023 may be formed by stacking the light-transmitting conductive film and the aluminum film and then performing selective etching. In this case, the etching can be performed using the same mask, which is preferable.

Further, the periphery of the first electrode 7023 is covered with a partition wall 7029. The partition 7029 is formed using an organic resin film of polyimide, acrylic, polyamide, epoxy, or the like, an inorganic insulating film, or organic polysiloxane. It is particularly preferable that the partition 7029 be formed using a photosensitive resin material to have an opening over the first electrode 7023 so that a sidewall of the opening is formed as an inclined surface with continuous curvature. In the case where a photosensitive resin material is used for the partition 7029, a step of forming a resist mask can be omitted.

The EL layer 7024 which is formed over the first electrode 7023 and the partition 7029 may include at least a light-emitting layer and be formed using a single layer or a plurality of layers stacked. When the EL layer 7024 is formed using a plurality of layers, an electron-injection layer, an electron-transport layer, a light-emitting layer, a hole-transport layer, and a hole-injection layer are stacked in the order over the first electrode 7023 functioning as a cathode. It is not necessary to form all of these layers.

The stacking order is not limited to the above; the first electrode 7023 is used as an anode and a hole-injection layer, a hole-transport layer, a light-emitting layer, an electron-transport layer, and an electron-injection layer may be stacked in that order over the first electrode 7023. However, considering power consumption, it is preferable that the first electrode 7023 is used as a cathode and an electron-injection layer, an electron-transport layer, a light-emitting layer, a hole-transport layer, and a hole-injection layer be stacked in the order over the cathode because power consumption can be reduced more effectively than in the case of using the first electrode 7023 as the anode and the layers stacked in the above order.

Further, any of a variety of materials can be used for the second electrode 7025 formed over the EL layer 7024. For example, in the case where the second electrode 7025 is used as an anode, a material having a high work function, for example, a transparent conductive material such as ITO, IZO, or ZnO is preferable. In this embodiment, the second electrode 7025 is formed using an ITO film including silicon oxide and is used as an anode.

The light-emitting element 7022 corresponds to a region where the EL layer 7024 including the light-emitting layer is sandwiched between the first electrode 7023 and the second electrode 7025. In the case of the element structure illustrated in FIG. 15B, light emitted from the light-emitting element 7022 is emitted from both the second electrode 7025 side and the first electrode 7023 side as indicated by arrows.

Note that in FIG. 15B, light emitted from the light-emitting element 7022 to the first electrode 7023 side passes through a color filter layer 7043, an insulating layer 7042, an oxide insulating layer 7041, a gate insulating layer 7040, and a substrate 7020 to be emitted.

The color filter layer 7043 is formed by a droplet discharge method such as an inkjet method, a printing method, an etching method with the use of a photolithography technique, or the like.

The color filter layer 7043 is covered with the overcoat layer 7044, and also covered with the protective insulating layer 7045.

A contact hole which is formed in the protective insulating layer 7045 and the insulating layer 7042 and reaches the drain electrode layer is provided in a portion which overlaps with the partition wall 7029.

Note that in the case where the light-emitting element having a dual emission structure is used and full color display is performed on both display surfaces, light from the second electrode 7025 side does not pass through the color filter layer 7043; therefore, a sealing substrate provided with another color filter layer is preferably provided on the second electrode 7025.

Next, a light-emitting element having a top emission structure is described with reference to FIG. 15C.

Figure 15C:
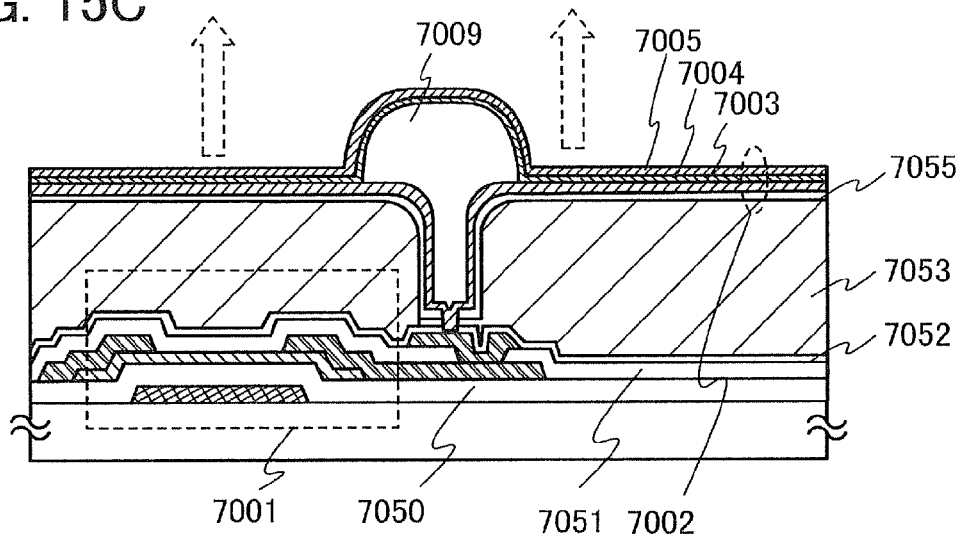

FIG. 15C is a cross-sectional view of a pixel in which the driver transistor 7001 is an n-channel transistor and light generated in a light-emitting element 7002 is emitted to pass through a second electrode 7005. In FIG. 15C, a first electrode 7003 of the light-emitting element 7002 is formed to be electrically connected to the drain electrode layer of the driver transistor 7001, and an EL layer 7004 and the second electrode 7005 are stacked in that order over the first electrode 7003.

Any of a variety of materials can be used for the first electrode 7003. For example, in the case of using the first electrode 7003 as a cathode, the first electrode 7003 is preferably formed using a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er.

As the EL layer 7004 formed over the first electrode 7003 and the partition wall 7009, an EL layer including at least a light-emitting layer is acceptable. Further, the EL layer 7004 may be formed to have either a single-layer structure or a stacked-layer structure. When the EL layer 7004 is formed using a plurality of layers, an electron-injection layer, an electron-transport layer, a light-emitting layer, a hole-transport layer, and a hole-injection layer are stacked in the order presented over the first electrode 7003 used as a cathode. It is not necessary to form all of these layers.

The stacking order is not limited to the above stacking order. A hole-injection layer, a hole-transport layer, a light-emitting layer, an electron-transport layer, and an electron-injection layer may be stacked in that order over the first electrode 7003 which is used as an anode.

In FIG. 15C, a hole-injection layer, a hole-transport layer, a light-emitting layer, an electron-transport layer, and an electron-injection layer are stacked in this order over a stacked film in which a Ti film, an aluminum film, and a Ti film are stacked in this order, and thereover, a stacked layer of a Mg:Ag alloy thin film and ITO is formed.

Note that when the transistor 7001 is an n-channel transistor, it is preferable that an electron-injection layer, an electron-transport layer, a light-emitting layer, a hole-transport layer, and a hole-injection layer be stacked in that order over the first electrode 7003 because voltage rise in the driver circuit can be suppressed and power consumption can be decreased.

The second electrode 7005 is formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

The light-emitting element 7002 corresponds to a region where the EL layer 7004 including the light-emitting layer is sandwiched between the first electrode 7003 and the second electrode 7005. In the case of the pixel illustrated in FIG. 15C, light is emitted from the light-emitting element 7002 to the second electrode 7005 side as indicated by an arrow.

Further, in FIG. 15C, the drain electrode layer of the transistor 7001 is electrically connected to the first electrode 7003 through a contact hole formed in the oxide insulating layer 7051, the protective insulating layer 7052, and the insulating layer 7055. A planarizing insulating layer 7053 can be formed using a resin material such as polyimide, acrylic, benzocyclobutene, polyamide, or epoxy. In addition to such resin materials, it is also possible to use a low-dielectric constant material (low-k material), a siloxane-based resin, phosphosilicate glass (PSG), borophosphosilicate glass (BPSG), or the like. Note that the planarizing insulating layer 7053 may be formed by stacking a plurality of insulating films formed of these materials. There is no particular limitation on the method for forming the planarizing insulating layer 7053, and the planarizing insulating layer 7053 can be formed, depending on the material, by a method such as a sputtering method, an SOG method, spin coating, dip coating, spray coating, or a droplet discharge method (such as an inkjet method, screen printing, offset printing, or the like), or with a tool (equipment) such as a doctor knife, a roll coater, a curtain coater, or a knife coater.

The partition wall 7009 is provided so as to insulate the first electrode 7003 and a first electrode 7008 of an adjacent pixel. The partition 7009 is formed using an organic resin film of polyimide, acrylic, polyamide, epoxy, or the like, an inorganic insulating film, or organic polysiloxane. It is particularly preferable that the partition wall 7009 be formed using a photosensitive resin material to have an opening over the first electrode 7003 so that a sidewall of the opening is formed to have an inclined surface with continuous curvature. In the case where a photosensitive resin material is used for the partition 7009, a step of forming a resist mask can be omitted.

In the structure illustrated in FIG. 15C, for performing full-color display, the light-emitting element 7002, one of adjacent light-emitting elements, and the other of the adjacent light-emitting elements are, for example, a green emissive light-emitting element, a red emissive light-emitting element, and a blue emissive light-emitting element, respectively. Alternatively, a light-emitting display device capable of full color display may be manufactured using four kinds of light-emitting elements which include a white light-emitting element in addition to three kinds of light-emitting elements.

Further alternatively, in the structure of FIG. 15C, all of a plurality of light-emitting elements which are arranged may be white light-emitting elements and a sealing substrate having a color filter or the like may be arranged over the light-emitting element 7002, so that a light-emitting display device capable of full color display may be manufactured. A material which exhibits a single color such as white is formed and combined with a color filter or a color conversion layer, whereby full color display can be performed.

Needless to say, display of monochromatic light can also be performed. For example, a lighting system may be formed with the use of white light emission, or an area-color light-emitting device may be formed with the use of a single color light emission.

If necessary, an optical film such as a polarizing film including a circularly polarizing plate may be provided.

Note that, although the organic EL elements are described here as the light-emitting elements, an inorganic EL element can also be provided as a light-emitting element.

Note that the example is described in which a transistor (a driver transistor) which controls the driving of a light-emitting element is electrically connected to the light-emitting element; however, a structure may be employed in which a transistor for current control is connected between the driver transistor and the light-emitting element.

A semiconductor device described in this embodiment is not limited to the structures illustrated in FIGS. 15A to 15C and can be modified in various ways based on the spirit of techniques according to the present invention.

Figure 16A:
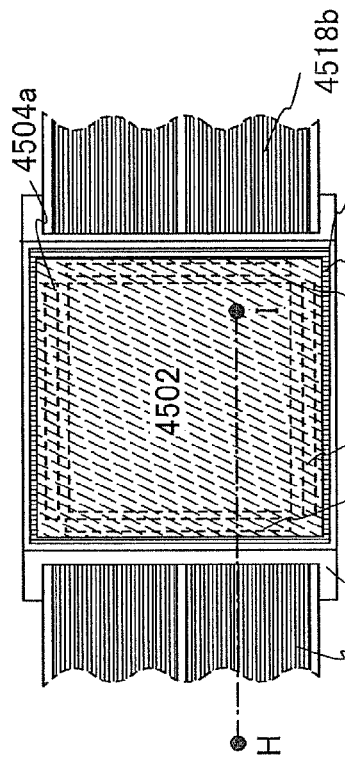
FIGS. 16A and 16B are a plan view and a cross-sectional view illustrating one embodiment of the present invention.
Figure 16B:
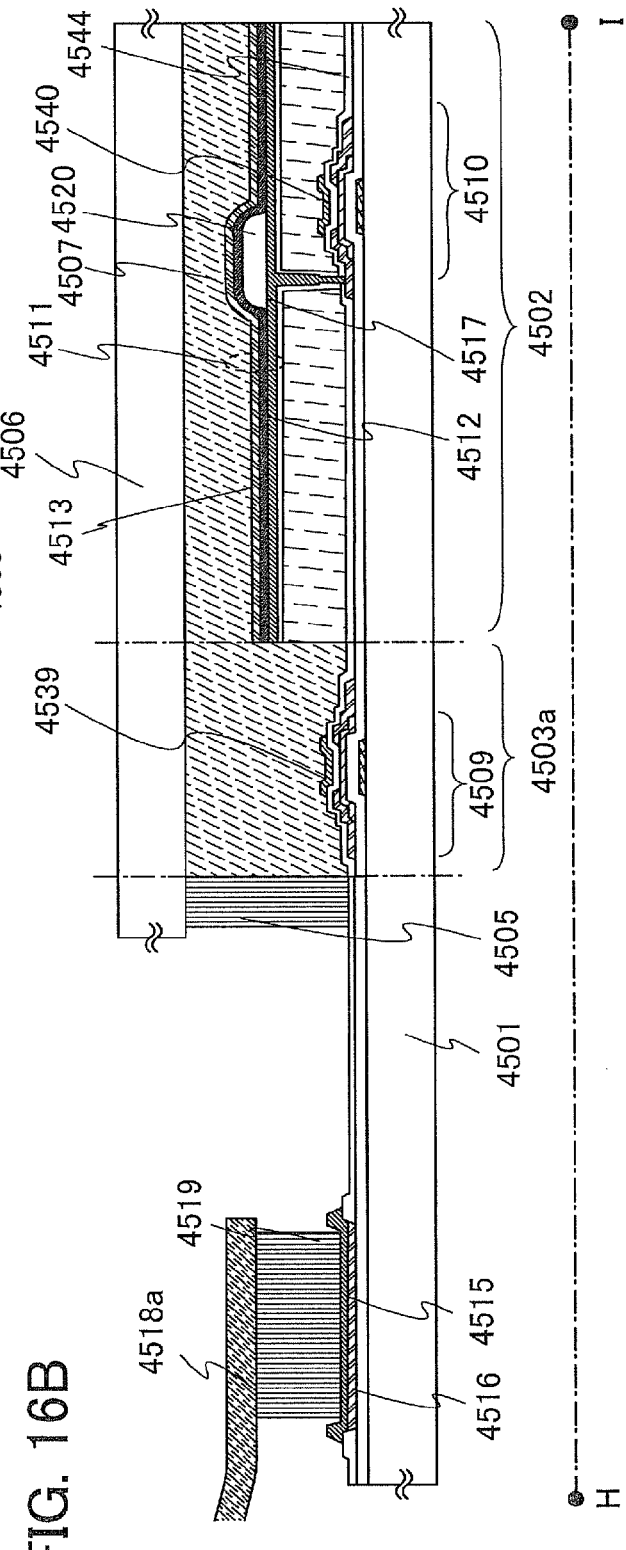

Next, the appearance and the cross section of a light-emitting display panel (also referred to as a light-emitting panel) which corresponds to one embodiment of a semiconductor device to which the transistor described in Embodiments 1 is applied are described with reference to FIGS. 16A and 16B. FIG. 16A is a top view of a panel in which transistors and a light-emitting element formed over a first substrate are sealed between the first substrate and a second substrate with a sealant. FIG. 16B is a cross-sectional view taken along line H-I of FIG. 16A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of transistors, and the transistor 4510 included in the pixel portion 4502 and the transistor 4509 included in the signal line driver circuit 4503a are illustrated as an example in FIG. 16B.

For each of the transistors 4509 and 4510, a highly reliable transistor including an In—Ga—Zn—O-based film as an oxide semiconductor film as described in Embodiment 1 can be used. In this embodiment, the transistors 4509 and 4510 are n-channel transistors.

Conductive layers 4539 and 4540 are provided over part of an insulating layer 4544 so as to overlap with channel formation regions of oxide semiconductor films in the transistors 4509 and 4510, respectively. By providing the conductive layers 4539 and 4540 so as to overlap with the channel formation regions of the oxide semiconductor films, the amount of change in the threshold voltage of the transistor 4509 and 4541 between before and after the BT test can be reduced. Further, potential of the conductive layers 4539 and 4540 may be the same as or different from that of gate electrodes of the transistors 4509 and 4510. The conductive layers 4539 and 4540 can function also as second gate electrodes of the transistors 4509 and 4510, respectively. Alternatively, the potential of the conductive layers 4539 and 4040 may be GND or 0 V, or the conductive layers 4539 and 4040 may be in a floating state.

Moreover, reference numeral 4511 denotes a light-emitting element. A first electrode layer 4517 which is a pixel electrode included in the light-emitting element 4511 is electrically connected to a source or drain electrode layer of the transistor 4510. Note that a structure of the light-emitting element 4511 is a stacked-layer structure of the first electrode layer 4517, an electroluminescent layer 4512, and a second electrode layer 4513, but there is no particular limitation on the structure. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

In this embodiment, a connection terminal electrode 4515 is formed using the same conductive film that is used for the first electrode layer 4517 included in the light-emitting element 4511. A terminal electrode 4516 is formed using the same conductive film that is used for the source and drain electrode layers included in the transistors 4509 and 4510.

The connection terminal electrode 4515 is electrically connected to a terminal included in the FPC 4518a via an anisotropic conductive film 4519.

As the second substrate located in the direction in which light is extracted from the light-emitting element 4511 needs to have a light-transmitting property. In that case, a light-transmitting material such as a glass plate, a plastic plate, a polyester film, or an acrylic film is used for the second substrate 4506.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this Embodiment, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scanning line driver circuits 4504a and 4504b may be mounted as driver circuits formed using a single crystal semiconductor film or a polycrystalline semiconductor film over a substrate separately prepared. Alternatively, only the signal line driver circuits or part thereof, or the scan line driver circuits or part thereof may be separately formed and mounted. This embodiment is not limited to the structure illustrated in FIGS. 16A and 16B.

Through the above process, a highly reliable light-emitting display device (display panel) as a semiconductor device can be manufactured.

Note that the structure described in this embodiment can be combined with any of the structures described in other embodiments as appropriate.

Embodiment 5

A semiconductor device to which the transistor described in Embodiment 1 is applied can be used as electronic paper. An electronic paper can be used for electronic devices of a variety of fields as long as they can display data. For example, an electronic paper can be applied to an e-book reader (electronic book), a poster, an advertisement in a vehicle such as a train, or displays of various cards such as a credit card. Examples of the electronic devices are illustrated in FIGS. 17A and 17B and FIG. 18.

Figure 17A:
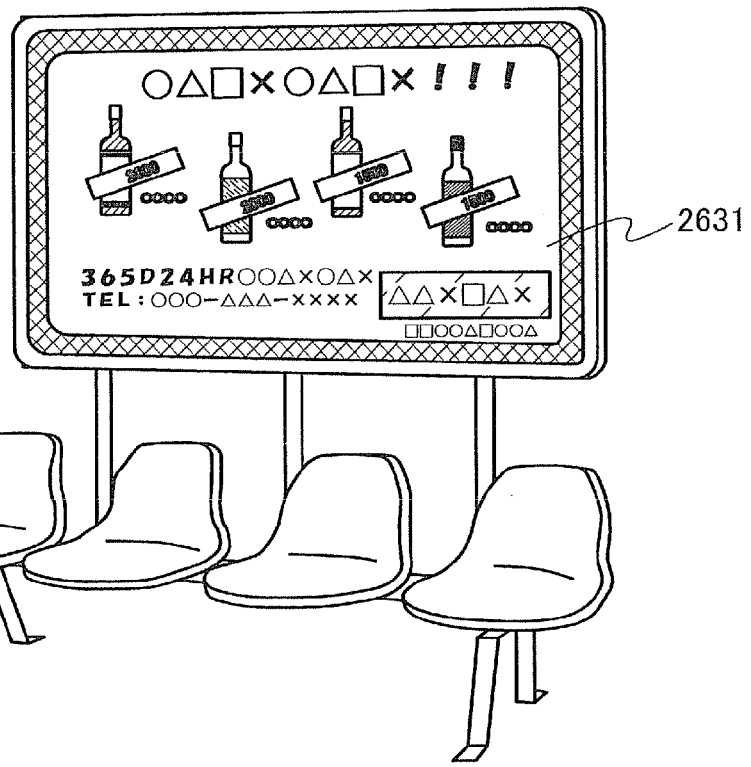
FIGS. 17A and 17B illustrate examples of usage patterns of electronic paper.

FIG. 17A illustrates a poster 2631 formed using electronic paper. In the case where an advertising medium is printed paper, the advertisement is replaced by hands; however, by using the electronic paper, the advertising display can be changed in a short time. Furthermore, stable images can be obtained without display defects. Note that the poster may have a configuration capable of wirelessly transmitting and receiving data.

Figure 17B:
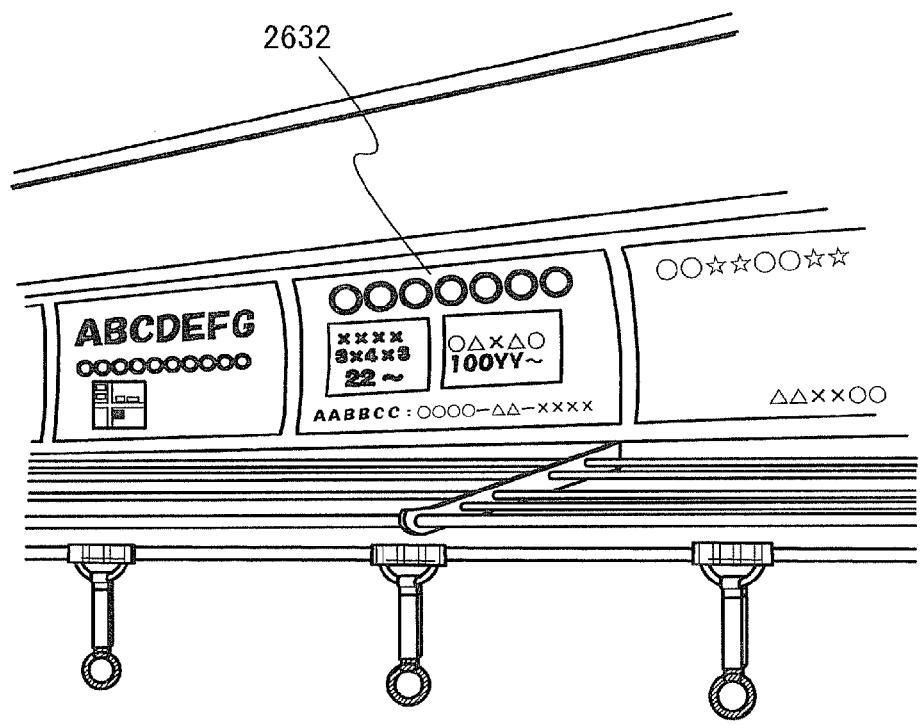

FIG. 17B illustrates an advertisement 2632 in a vehicle such as a train. In a case where an advertising medium is paper, a man replaces advertising, but in a case where it is electronic paper, much manpower is not needed and replacement of advertising can be conducted in a short time. Furthermore, stable images can be obtained without display defects. Note that the advertisement in a vehicle may have a configuration capable of wirelessly transmitting and receiving data.

Figure 18:
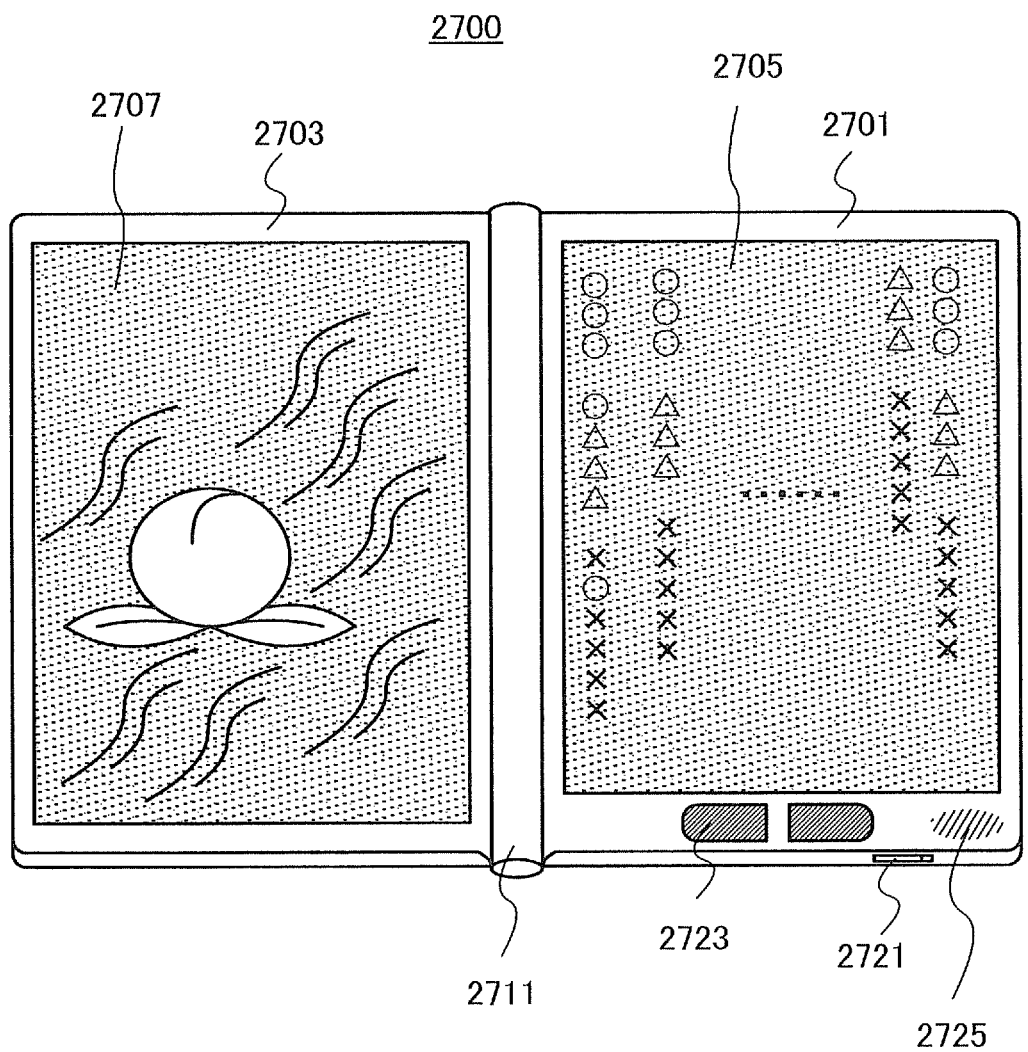
FIG. 18 is an external view of one example of an e-book reader.

FIG. 18 illustrates an example of an electronic book reader. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 18) can display text and a display portion on the left side (the display portion 2707 in FIG. 18) can display graphics.

FIG. 18 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Note that the structure described in this embodiment can be combined with any of the structures described in other embodiments as appropriate.

Embodiment 6

A semiconductor device using the transistor described in Embodiment 1 can be applied to a variety of electronic devices (including an amusement machine). Examples of electronic devices are a television set (also referred to as a television or a television receiver), a monitor of a computer or the like, a camera such as a digital camera or a digital video camera, a digital photo frame, a cellular phone (also referred to as a mobile phone or a mobile phone device), a portable game console, a portable information terminal, an audio reproducing device, a large-sized game machine such as a pachinko machine, and the like.

Figure 19A:
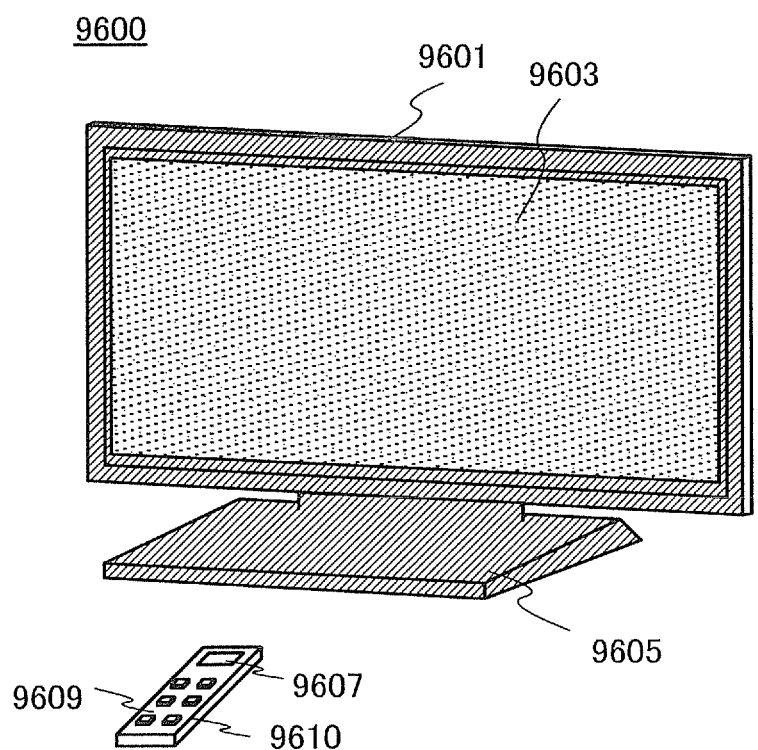
FIGS. 19A and 19B are external views illustrating examples of a television device and a digital photo frame, respectively.

FIG. 19A illustrates an example of a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 19B:
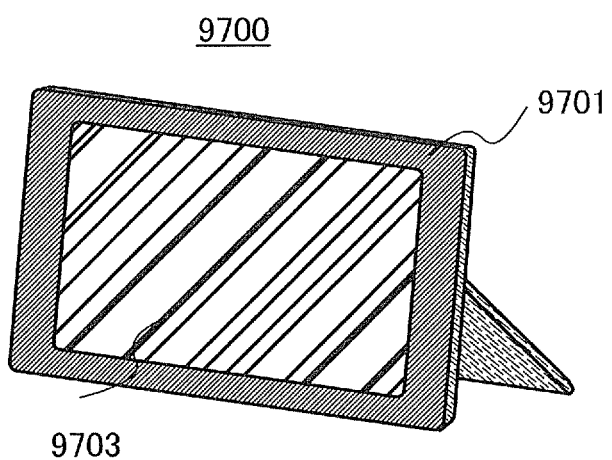

FIG. 19B illustrates an example of a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 20A:
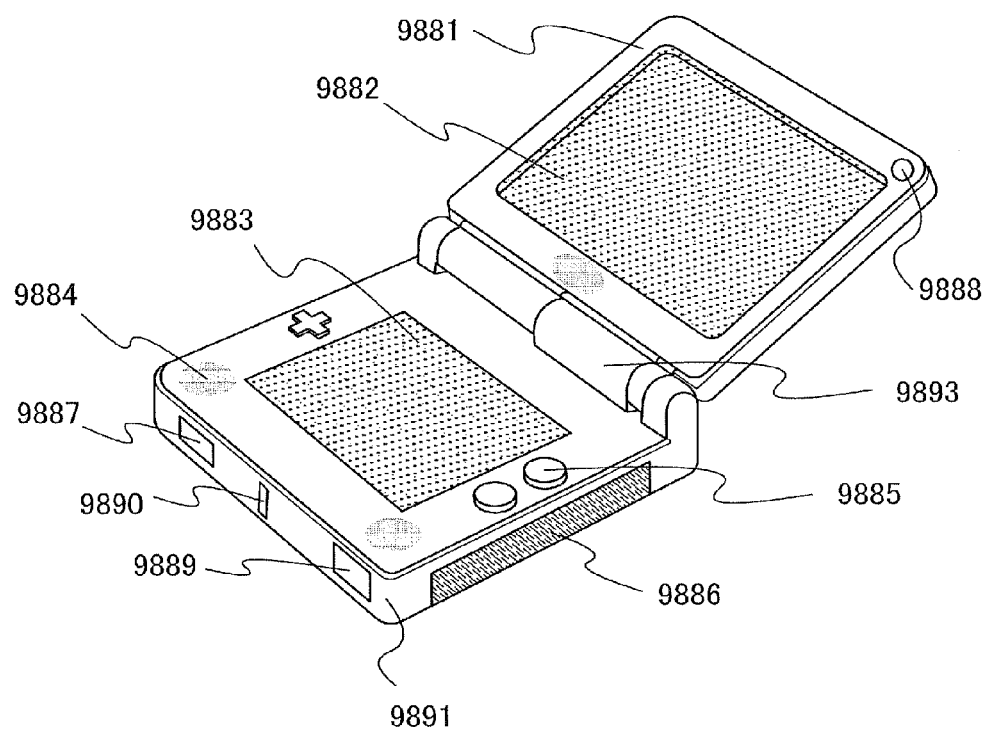
FIGS. 20A and 20B are external views illustrating examples of game machines.

FIG. 20A is a portable game machine and includes two housings, a housing 9881 and a housing 9891, which are connected with a joint portion 9893 so that the portable game machine can be opened or folded. A display portion 9882 and a display portion 9883 are incorporated in the housing 9881 and the housing 9891, respectively. The portable game machine illustrated in FIG. 20A additionally includes a speaker portion 9884, a storage medium inserting portion 9886, an LED lamp 9890, an input means (operation keys 9885, a connection terminal 9887, a sensor 9888 (including a function of measuring force, displacement, position, speed, acceleration, angular speed, the number of rotations, distance, light, liquid, magnetism, temperature, chemical substance, sound, time, hardness, electric field, current, voltage, electric power, radiation, flow rate, humidity, tilt angle, vibration, smell, or infrared ray), a microphone 9889, and the like). It is needless to say that the structure of the portable amusement machine is not limited to the above and other structures provided with at least a semiconductor device of the present invention may be employed. The portable amusement machine may include other accessory equipment as appropriate. The portable game machine illustrated in FIG. 20A has a function of reading out a program or data stored in a storage medium to display it on the display portion, and a function of sharing information with another portable game machine by wireless communication. Note that functions of the portable game machine illustrated in FIG. 20A are not limited to them, and the portable game machine can have various functions.

Figure 20B:
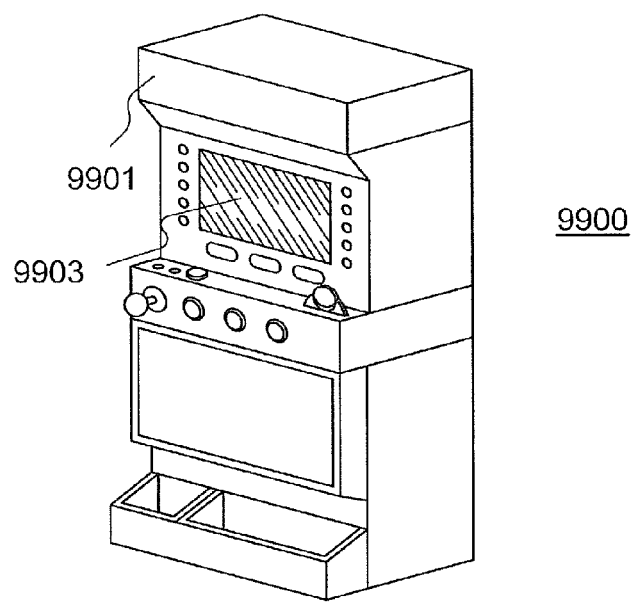

FIG. 20B illustrates an example of a slot machine 9900, which is a large game machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device of the present invention may be employed. The slot machine 9900 may include other accessory equipment as appropriate.

Figure 21A:
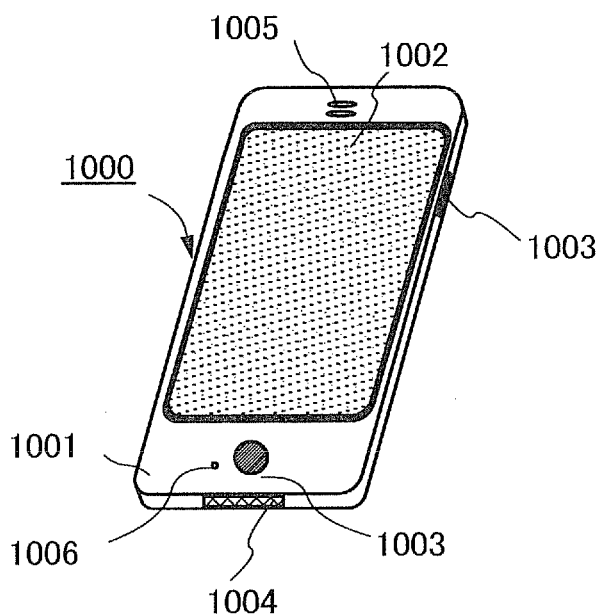
FIGS. 21A and 21B are external views illustrating examples of cellular phones.

FIG. 21A illustrates an example of a cellular phone 1000. The cellular phone 1000 includes a display portion 1002 incorporated in a housing 1001, an operation button 1003, an external connection port 1004, a speaker 1005, a microphone 1006 and the like.

When the display portion 1002 of the cellular phone 1000 illustrated in FIG. 21A is touched with a finger or the like, data can be input into the cellular phone handset 1000. Furthermore, operations such as making calls and composing mails can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in a case of making a call or composing a mail, a text input mode mainly for inputting text is selected for the display portion 1002 so that text displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the cellular phone 1000, display in the screen of the display portion 1002 can be automatically switched by determining the installation direction of the cellular phone 1000 (whether the cellular phone 1000 is placed horizontally or vertically for a landscape mode or a portrait mode).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

Figure 21B:
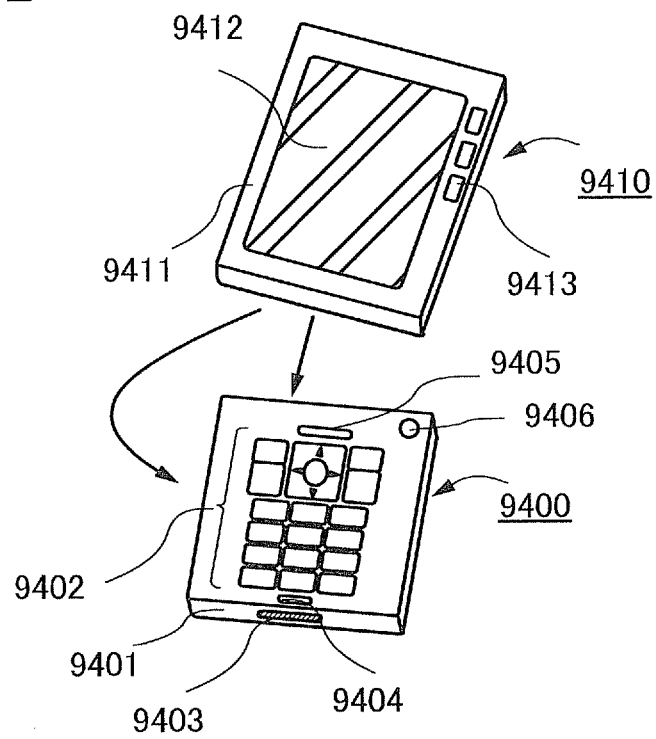

FIG. 21B illustrates another example of a cellular phone. The cellular phone illustrated in FIG. 21B is provided with a display device 9410 having a display portion 9412 and operation buttons 9413 in a housing 9411 and a communication device 9400 having operation buttons 9402, an external input terminal 9403, a microphone 9404, a speaker 9405, and a light-emitting portion 9406 which emits light when receiving a call in a housing 9401. The display device 9410 having a display function can be detached from or attached to the communication device 9400 having a telephone function in two directions indicated by arrows. Thus, the display device 9410 and the communication device 9400 can be attached to each other along their short sides or long sides. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

Note that the structure described in this embodiment can be combined with any of the structures described in other embodiments as appropriate.

Example 1

Thin film transistors of one embodiment of the present invention described in Embodiment 1 were manufactured, and the characteristics of the thin film transistors in environments at −25° C. to 150° C. were evaluated. The evaluation results are described in this example.

In this example, a TFT-1 (L/W=3 μm/24 μm) using an oxide semiconductor film as an active layer, whose manufacturing method was described in Embodiment 1, was used for the evaluation of the characteristics of the thin film transistors. Further, a comparative TFT-3 (L/W=3.7 μm/22 μm) using amorphous silicon as an active layer, which was described in Embodiment 1 as a comparative example, was used.

Figure 22A:
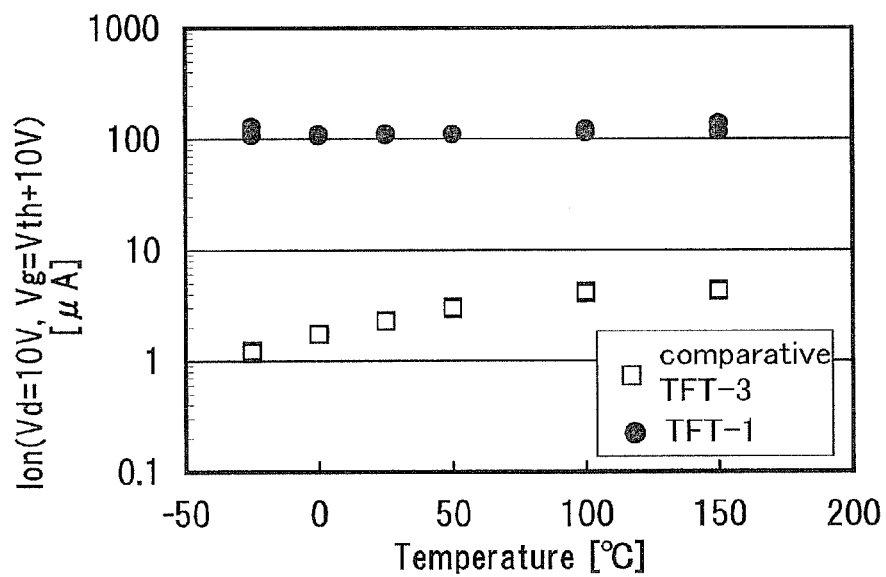
FIGS. 22A and 22B are graphs showing temperature dependence of a transistor including an oxide semiconductor film and a transistor including amorphous silicon.

FIG. 22A shows temperature dependence of on-state current (Ion) of the TFT-1 and the comparative TFT-3. In FIG. 22A, the vertical axis represents on-state current (Ion) of a TFT which is shown with a logarithmic scale when drain voltage (Vd) of the TFT is 10V, and gate voltage (Vg) is a threshold voltage (Vth) +10V, and a horizontal axis represents a temperature (° C.).

In FIG. 22A, in the comparative TFT-3 using amorphous silicon as an active layer, on-state current is increased with increase in temperature, and the rate of increase in on-state current hits a peak at 100° C. or more. On the other hand, in the TFT-1 using an oxide semiconductor film as an active layer according to one embodiment of the present invention, a constant on-state current is given regardless of a change in temperature, and the temperature dependence of the on-state current is hardly observed.

Figure 22B:
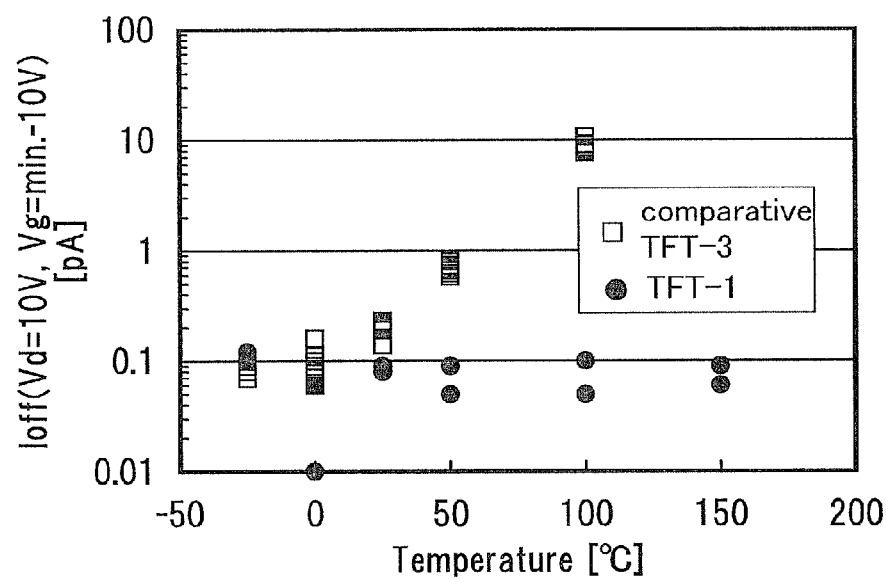

Further, FIG. 22B shows temperature dependence of off-state current (Ioff) of the TFT-1 and the comparative TFT-3. In FIG. 22B, the vertical axis represents off-state current (Ioff) of a TFT which is shown with a logarithmic scale when drain voltage (Vd) of the TFT is 10V, and gate voltage (Vg) is gate voltage (Vg) at the minimum off-state current −10V, and a horizontal axis represents a temperature (° C.).

In FIG. 22B, in the comparative TFT-3 using amorphous silicon as an active layer, off-state current is increased with increase in temperature. On the other hand, in the TFT-1 using an oxide semiconductor film as an active layer according to one embodiment of the present invention, off-state current (Ioff) is extremely low, which is less than or equal to the minimum limit of detection, and the temperature dependence of the off-state current is hardly observed.

Figure 23A:
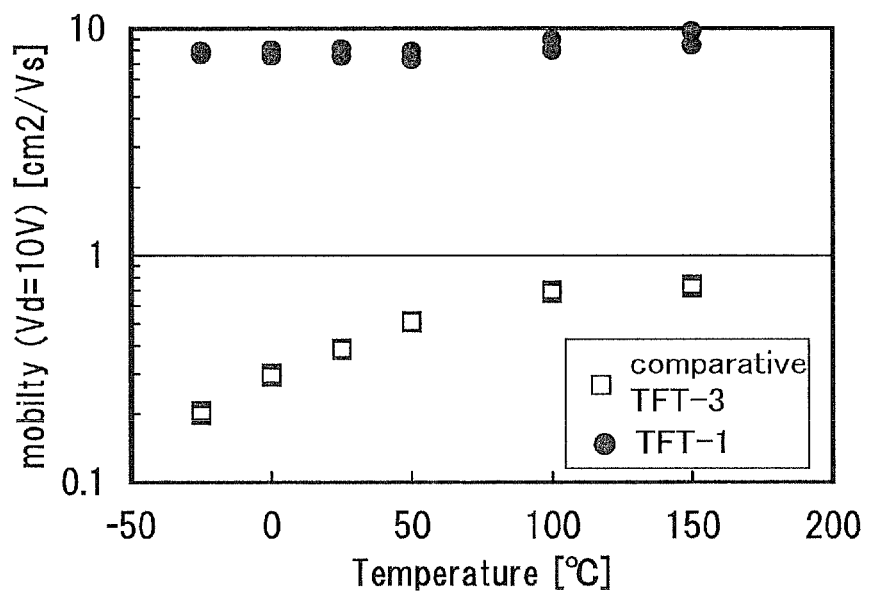
FIGS. 23A and 23B are graphs showing temperature dependence of a transistor including an oxide semiconductor film and a transistor including amorphous silicon.

Further, FIG. 23A shows temperature dependence of the mobility of the TFT-1 and the comparative TFT-3. In FIG. 23A, the vertical axis represents mobility (cm$^2$/Vs) when drain voltage is 10V, and the horizontal axis represents a temperature (° C.).

In FIG. 23A, in the comparative TFT-3 using amorphous silicon as an active layer, the mobility is increased with increase in temperature. On the other hand, in the TFT-1 using an oxide semiconductor film as an active layer according to one embodiment of the present invention, temperature dependence is lower than the comparative TFT-3.

Figure 23B:
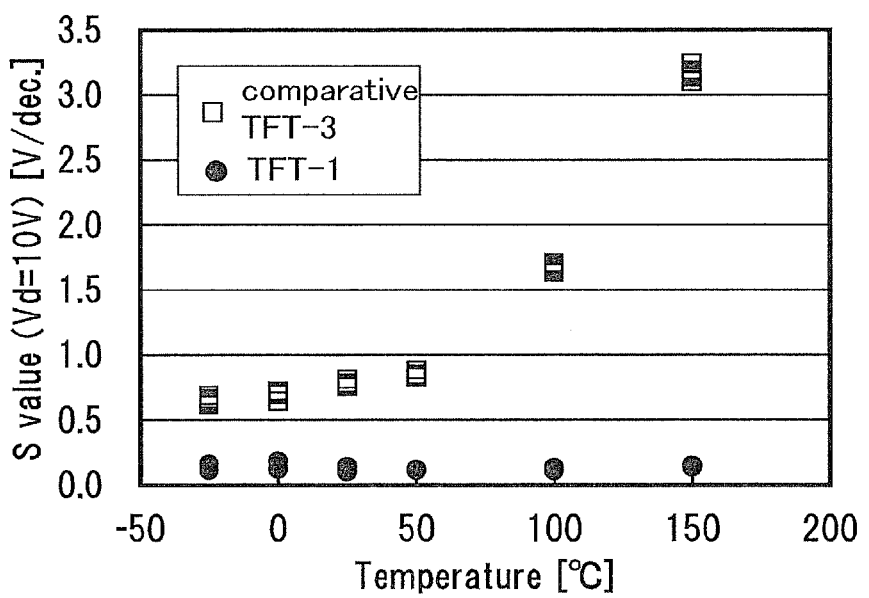

Further, FIG. 23B shows temperature dependence of a S value of the TFT-1 and the comparative TFT-3. In FIG. 23A, the vertical axis represents the S value (V/dec.) when drain voltage of the TFT is 10V, and the horizontal axis represents a temperature (° C.).

In FIG. 23B, in the comparative TFT-3 using a-Si as an active layer, the S value is rapidly deteriorated with increase in temperature. On the other hand, in the TFT-1 using an oxide semiconductor film as an active layer according to one embodiment of the present invention, temperature dependence is lower than the comparative TFT-3.

Accordingly, in the thin film transistor according to one embodiment of the present invention, the effect of the temperature change on the characteristics such as on-state current, off-state current, mobility, and S value is extremely low compared to the case of using a thin film transistor using amorphous silicon as an active layer.

This application is based on Japanese Patent Application serial no. 2009-276740 filed with Japan Patent Office on Dec. 4, 2009, the entire contents of which are hereby incorporated by reference.

What is claimed is:

1. A semiconductor device comprising:
a substrate;
a gate electrode over the substrate;
a gate insulating film over the gate electrode;
an oxide semiconductor film over the gate insulating film;
a source and a drain over the oxide semiconductor film; and
an insulating film over the oxide semiconductor film,
wherein a value of an activation energy of the oxide semiconductor film is greater than or equal to 0 meV and less than or equal to 25 meV.

2. The semiconductor device according to claim 1,
wherein a surface of the substrate is performed with a first heat treatment,
wherein a surface of the oxide semiconductor film is performed with a second heat treatment, and
wherein a surface of the gate insulating film is performed with a third heat treatment.

3. A semiconductor device comprising:
a gate electrode;
a gate insulating film over the gate electrode;
an oxide semiconductor film over the gate insulating film;
a source electrode and a drain electrode over the oxide semiconductor film; and
an insulating film being in contact with a part of the oxide semiconductor film, over the source electrode and the drain electrode,
wherein a value of an activation energy of the oxide semiconductor film is greater than or equal to 0 meV and less than or equal to 25 meV.

4. The semiconductor device according to claim 3, wherein the activation energy of the oxide semiconductor film is greater than or equal to 0 meV and less or equal to 20 meV.

5. The semiconductor device according to claim 3, wherein a film thickness of the gate insulating film is greater than or equal to 10 nm and less than or equal to 500 nm.

6. The semiconductor device according to claim 3, wherein a film thickness of the oxide semiconductor film is from 10 nm to 300 nm.

7. The semiconductor device according to claim 3, wherein the source electrode and the drain electrode include titanium, magnesium, yttrium, aluminum, tungsten, or molybdenum.

8. The semiconductor device according to claim 3, further comprising a transistor including the gate electrode, the gate insulating film, the oxide semiconductor film, the source electrode and the drain electrode,
wherein an off current of the transistor is less than or equal to $1\times10^{-13}$ A.

9. The semiconductor device according to claim 3,
wherein the value of the activation energy is obtained from temperature dependence of a current flowing between the source electrode and the drain electrode when a voltage greater than or equal to a threshold voltage is applied to the gate electrode.

10. A semiconductor device comprising:
a transistor including a gate electrode, a gate insulating film, a source electrode, a drain electrode, and an oxide semiconductor film,
wherein a value of an activation energy of the oxide semiconductor film is greater than or equal to 0 meV and less than or equal to 25 meV.

11. The semiconductor device according to claim 10, wherein the activation energy of the oxide semiconductor film is greater than or equal to 0 meV and less or equal to 20 meV.

12. The semiconductor device according to claim 10, wherein a film thickness of the gate insulating film is greater than or equal to 10 nm and less than or equal to 500 nm.

13. The semiconductor device according to claim 10, wherein a film thickness of the oxide semiconductor film is from 10 nm to 300 nm.

14. The semiconductor device according to claim 10, wherein the source electrode and the drain electrode include titanium, magnesium, yttrium, aluminum, tungsten, or molybdenum.

15. The semiconductor device according to claim 10,
wherein an Off current of the transistor is less than or equal to $1\times10^{-13}$ A.

16. The semiconductor device according to claim 10,
wherein the value of the activation energy is obtained from temperature dependence of a current flowing between the source electrode and the drain electrode when a voltage greater than or equal to a threshold voltage is applied to the gate electrode.

17. The semiconductor device according to claim 10,
wherein the transistor is a bottom gate transistor.

* * * * *